United States Patent
Nakayama et al.

(10) Patent No.: US 9,843,011 B2
(45) Date of Patent: Dec. 12, 2017

(54) ORGANIC ELECTROLUMINESCENT ELEMENT HAVING INTERMEDIATE ELECTRODE INCLUDING TWO METAL LAYERS

(71) Applicant: Konica Minolta, Inc., Tokyo (JP)

(72) Inventors: Tomoyuki Nakayama, Hino (JP); Kazuhiro Yoshida, Tachikawa (JP); Hiroshi Ishidai, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/439,086

(22) PCT Filed: Oct. 4, 2013

(86) PCT No.: PCT/JP2013/077060
§ 371 (c)(1),
(2) Date: Apr. 28, 2015

(87) PCT Pub. No.: WO2014/073300
PCT Pub. Date: May 15, 2014

(65) Prior Publication Data
US 2015/0318513 A1 Nov. 5, 2015

(30) Foreign Application Priority Data
Nov. 9, 2012 (JP) ................. 2012-247370

(51) Int. Cl.
H01L 29/08 (2006.01)
H01L 51/52 (2006.01)
H01L 27/32 (2006.01)
H05B 33/26 (2006.01)
H05B 33/28 (2006.01)
H01L 51/50 (2006.01)

(52) U.S. Cl.
CPC ...... H01L 51/5212 (2013.01); H01L 27/3206 (2013.01); H01L 27/326 (2013.01);
(Continued)

(58) Field of Classification Search
CPC ............. H01L 51/5044; H01L 51/5212; H01L 51/5278; H01L 27/3206; H01L 27/326
(Continued)

(56) References Cited

U.S. PATENT DOCUMENTS 5,707,745 A 1/1998 Forrest et al.

FOREIGN PATENT DOCUMENTS

| EP | 0715803 B1 | 10/1997 |
| JP | 2007242601 A | 9/2007 |

(Continued)

OTHER PUBLICATIONS

The International Preliminary Report on Patentability dated May 12, 2015 from the corresponding International Patent Application No. PCT/JP2013/077060.
(Continued)

Primary Examiner — Matthew Gordon
(74) Attorney, Agent, or Firm — Lucas & Mercanti, LLP

(57) ABSTRACT

An organic EL device includes at least two light-emitting units and at least one intermediate electrode that are disposed between a lower electrode and an upper electrode, the at least one intermediate electrode being electrically connected to an external power source. The at least one intermediate electrode is disposed between the at least two light-emitting units. At least one of the at least one intermediate electrode consists of a first metal layer composed of a metal with a work function of 3 eV or lower and a second metal layer adjoining the first metal layer and composed of another metal with a work function of 4 eV or higher. The first and second metal layers have a total thickness of 15 nm or less. The first metal layer is adjacent to an anode side of the second metal layer, when a voltage is applied across the intermediate electrode and the electrode opposing the intermediate electrode.

12 Claims, 2 Drawing Sheets

(52) U.S. Cl.
CPC ...... *H01L 51/5044* (2013.01); *H01L 51/5278* (2013.01); *H05B 33/26* (2013.01); *H05B 33/28* (2013.01)

(58) Field of Classification Search
USPC .......................................................... 257/40
See application file for complete search history.

(56) References Cited

FOREIGN PATENT DOCUMENTS

| | | | |
|---|---|---|---|
| JP | 2009524189 A | | 6/2009 |
| JP | 2009146860 A | * | 7/2009 |
| JP | 2011040412 A | | 2/2011 |
| JP | 2012169266 A | * | 9/2012 |
| JP | 2012195054 A | | 10/2012 |

OTHER PUBLICATIONS

English translation of the International Preliminary Report on Patentability dated May 12, 2015 from the corresponding International Patent Application No. PCT/JP2013/077060.

International Search Report dated Dec. 3, 2013 for Application No. PCT/JP2013/077060.

Notification of Refusal dated Jun. 6, 2017 from the corresponding Japanese Patent Application No. JP 2014-545613 and English translation.

* cited by examiner

ORGANIC ELECTROLUMINESCENT ELEMENT HAVING INTERMEDIATE ELECTRODE INCLUDING TWO METAL LAYERS

CROSS REFERENCE TO RELATED APPLICATION

This Application is a 371 of PCT/JP2013/077060 filed on Oct. 4, 2013 which, in turn, claimed the priority of Japanese Patent Application No. JP2012-247370 filed on Nov. 9, 2012, both applications are incorporated herein by reference.

TECHNICAL FIELD

The present invention relates to an organic electroluminescent device.

BACKGROUND ART

Electroluminescent displays (ELDs) are light emissive electronic display devices. ELDs are categorized into inorganic electroluminescent devices (inorganic EL devices) and organic electroluminescent devices (organic EL devices).

Inorganic EL devices, which have been used as planar light source, require high AC voltage to be driven.

An organic EL device usually has a luminous layer containing a luminescent compound disposed between a cathode and an anode. In the organic EL device, electrons and holes are injected into a luminous layer to recombine therein, which generates excitons. The excitons are deactivated while emitting light (fluorescence or phosphorescence). The organic EL device emits light in such a manner. Organic EL devices can emit light at a low voltage in the range of several volts to several tens of volts. Organic EL devices also provide a wide viewing angle and high visibility due to their self-luminescent characteristics. Organic EL devices are also attracting attention from the viewpoints of space saving and portability because they are full solid state thin-film device.

Another great feature of organic EL devices is being a surface light source, unlike major light sources conventionally put into practical use, for example, light emitting diodes and cold cathode tubes. Applications of organic EL devices that effectively exploit such a property include light sources for lighting and backlights of various displays. Organic EL devices are particularly suitable for backlights of full-color liquid crystal displays that have been increasingly demanded in recent years.

If an organic EL device is used as such a light source for lighting or display backlight, the organic EL device is normally used as a light source which emits white light or so-called incandescent light (hereinafter, "white" and "incandescent" are collectively referred to as "white"). The organic EL device can also be used as a light source for lighting in the form of a panel which emits any color, such as blue, green, red, and intermediate colors thereof.

In a field of lighting, a light source for color-adjustable lighting has been demanded in recent years not only in the area of so-called design lighting but also in the area of general interior lighting. An organic EL device to be used as a light source for lighting also preferably has such a function.

Generally, an organic EL device has a basic layer structure composed of an anode, an organic luminous layer, and a cathode, and optionally has one or more layers, such as a hole injection layer, a hole transport layer, an electron transport layer, and electron injection layer.

An organic EL device with such a structure generally involves a tradeoff between luminance and driving lifetime. For solving the tradeoff, organic EL devices have been studied from various viewpoints, such as organic materials, the structure of the organic layer, and the driving mode of the devices.

From the viewpoint of the structure of the organic layer, as a technique for solving the tradeoff, a device structure has been proposed, which includes a laminate of several luminous units separated by one or more intermediate layers therebetween, each luminous unit including one or more luminous functional layers including a luminous layer composed of an organic material. Such a device has a prolonged lifetime while maintaining luminance, or can emit light with high luminance without a significant reduction in the driving lifetime.

Driving modes of a device with such a structure are classified into two major groups. One is to drive the device while the intermediate layer is being in an electrically floating state, and the other is to drive the device while the intermediate layer is connected to an external power source so as to serve as a so-called intermediate electrode and a voltage is directly applied to each light-emitting unit.

The latter mode can solve the tradeoff between the luminance and the device lifetime. In addition, an organic EL device that includes light-emitting units emitting light of mutually different colors can emit color-matched light through adjustment of brightness of individual light-emitting units.

PTLs 1 to 4 disclose exemplary structures of such an organic EL device having an intermediate electrode.

PTLs 1 and 2 each disclose a structures with an intermediate electrode composed of ITO (indium tin oxide) as a material.

ITO has high transparency and desirable properties for use as an intermediate electrode of an organic EL device. For formation of a film, sputtering is generally used. Unfortunately, such a film forming technique involves a risk of damage of an organic layer, resulting in unsatisfactory properties of the resulting organic EL device. In order to solve such a problem, several methods for preventing or reducing damage of the organic layer have been proposed, such as providing a metal thin film layer between an organic layer and an ITO electrode and applying a very low film formation rate in sputtering. However, such methods involve complex layer structure and production process and increased producing costs.

PTL 3 discloses an organic EL device including a charge generating layer containing an elemental metal or a metal compound that has a work function of 3 eV or lower and a compound with a work function of 4 eV or higher. The "compound with a work function of 4 eV or higher" is not a metal compound and thus is not so much electrically conductive as metal materials, that is, its conductivity is entirely inadequate to exhibit functions as an intermediate electrode. Furthermore, the charge generating layer disclosed in PTL 3 is not connected to an external power source.

PTL 4 discloses an organic EL device having an electrode layer composed of a mixture of a metal with a work function of 4.2 eV or lower, a metal with a work function of higher than 4.2 eV, and an organic compound, or an electrode layer composed of a laminate of sublayers which separately contain one of the aforementioned metals with an organic compound. Such an electrode layer is supposed to be used as a charge generating layer or a layer adjacent to an electrode with higher conductivity. Such a layer containing an organic compound has an entirely inadequate conductivity, which is lower than that of a layer composed of an elemental metal.

PRIOR ART DOCUMENT

Patent Literature

[PTL 1] European Patent No. 0715803
[PTL 2] U.S. Pat. No. 5,707,745
[PTL 3] Japanese Laid-Open Patent Application Publication No. 2007-242601
[PTL 4] Japanese Laid-Open Patent Application Publication No. 2011-040412

SUMMARY OF INVENTION

Problems to be Solved by the Invention

The present invention has been accomplished under such a circumference, and an object of the invention is to provide a color-adjustable organic EL device having high luminous efficiency, low driving voltage and excellent preservation stability, which has an intermediate electrode with light transmittance and conductivity sufficient to be replaced with the ITO electrode.

Means for Solving the Problem

The present inventors have been studying a source and solution of the problems described above, and have completed an organic EL device of the present invention including at least two light-emitting units and at least one intermediate electrode that are disposed between a lower electrode and an upper electrode, the at least one intermediate electrode being electrically connected to an external power source and disposed between the at least two light-emitting units, wherein: at least one of the at least one intermediate electrode consists of a first metal layer composed of a metal with a work function of 3 eV or lower and a second metal layer adjoining the first metal layer and composed of another metal with a work function of 4 eV or higher, the first and second metal layers having a total thickness of 15 nm or less; and the first metal layer is adjacent to an anode side of the second metal layer, when a voltage is applied across the intermediate electrode and the electrode opposing the intermediate electrode.

The present invention involves the following aspects:
1. An organic electroluminescent device comprising at least two light-emitting units and at least one intermediate electrode that are disposed between a lower electrode and an upper electrode, the at least one intermediate electrode being electrically connected to an external power source and disposed between the at least two light-emitting units, wherein:
at least one of the at least one intermediate electrode consists of a first metal layer comprising a metal with a work function of 3 eV or lower and a second metal layer adjoining the first metal layer, the second metal layer comprising another metal with a work function of 4 eV or higher, the first and second metal layers having a total thickness of 15 nm or less; and
the first metal layer is adjacent to an anode side of the second metal layer, when a voltage is applied across the intermediate electrode and the electrode opposing the intermediate electrode.

2. The organic electroluminescent device according to Aspect 1,
wherein the first metal layer has a thickness of 3 nm or less.
3. The organic electroluminescent device according to Aspect 1 or 2,
wherein the second metal layer has a thickness of 10 nm or less.
4. The organic electroluminescent device according to any one of Aspects 1 to 3,
wherein the second metal layer comprises silver.
5. The organic electroluminescent device according to any one of Aspects 1 to 4,
wherein the first metal layer comprises lithium or calcium.
6. The organic electroluminescent device according to any one of Aspects 1 to 5,
wherein the light-emitting units separated by the intermediate electrode emit light of different colors.
7. The organic electroluminescent device according to any one of Aspects 1 to 6, wherein
the at least two light-emitting units comprises at least three light-emitting units and the at least one intermediate electrode comprises at least two intermediate electrodes that are disposed between the lower electrode and the upper electrode, each intermediate electrode being electrically connected to an external power source and disposed between two of the at least three light-emitting units.
8. The organic electroluminescent device according to any one of Aspects 1 to 7, emitting white light through mixing of color light components emerging from the light-emitting units.

Advantageous Effects of Invention

The present invention provides a color-adjustable organic electroluminescent device including an intermediate electrode with high light transmittance and conductivity, which thus has high luminous efficiency, low driving voltage and excellent preservation stability.

EMBODIMENT FOR CARRYING OUT THE INVENTION

Figure 1:
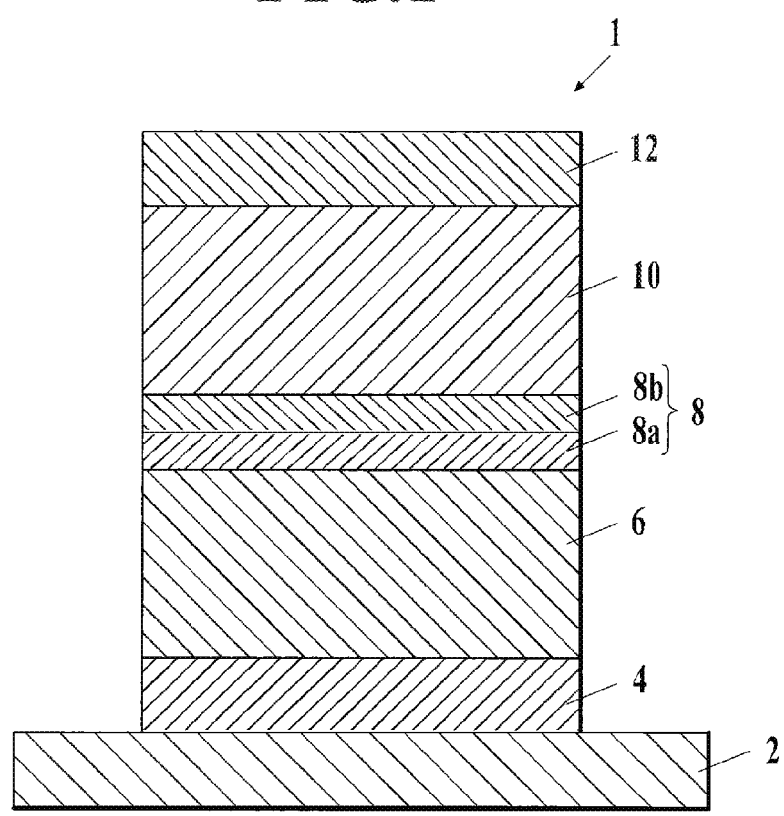
FIG. 1 is a schematic cross-sectional view illustrating an example of the organic EL device of the present invention.

The organic electroluminescent device of the present invention includes at least two light-emitting units and at least one intermediate electrode that are disposed between a lower electrode and an upper electrode, the at least one intermediate electrode being electrically connected to an external power source. The at least one intermediate electrode is disposed between the at least two light-emitting units. At least one of the at least one intermediate electrode consists of a first metal layer composed of a metal with a work function of 3 eV or lower and a second metal layer adjoining the first metal layer and composed of another metal with a work function of 4 eV or higher. The first and second metal layers have a total thickness of 15 nm or less. The first metal layer is adjacent to an anode side of the second metal layer, when a voltage is applied across the intermediate electrode and the electrode opposing the intermediate electrode.

The organic EL device of the present invention may be suitable for a lighting device.

The present invention, elements of the present invention and embodiments of the present invention will now be described in detail.

As used herein, the expression "to" indicating a numerical range is meant to be inclusive of the boundary values.

<<Layer Structure of Organic EL Device>>

Non-limiting examples of the preferred layer structures of the organic EL device of the present invention are listed below.

(I) Lower electrode/first light-emitting unit/intermediate electrode/second light-emitting unit/upper electrode (II) Lower electrode/first light-emitting unit/first intermediate electrode/second light-emitting unit/second intermediate electrode/third light-emitting unit/upper electrode (III) Lower electrode/first light-emitting unit/first intermediate electrode/second light-emitting unit/second intermediate electrode/third light-emitting unit/third intermediate electrode/fourth light-emitting unit/upper electrode (I-1) Lower electrode/white light-emitting unit/intermediate electrode/white light-emitting unit/upper electrode (I-2) Lower electrode/blue light-emitting unit/intermediate electrode/green/red light-emitting unit/upper electrode (I-3) Lower electrode/green/red light-emitting unit/intermediate electrode/blue light-emitting unit/upper electrode (II-1) Lower electrode/blue light-emitting unit/first intermediate electrode/blue light-emitting unit/second intermediate electrode/green/red light-emitting unit/upper electrode (II-2) Lower electrode/blue light-emitting unit/first intermediate electrode/green light-emitting unit/second intermediate electrode/red light-emitting unit/upper electrode (II-3) Lower electrode/green light-emitting unit/first intermediate electrode/red light-emitting unit/second intermediate electrode/blue light-emitting unit/upper electrode According to the present invention, the number of the light-emitting units may be any number above one, but is preferably two to ten, more preferably two to four, from the viewpoint of production efficiency. N light-emitting units (N is an integer of 2 or more) requires N−1 intermediate electrodes in the present invention.

As an example of the organic EL device of the present invention, an organic EL device with above structure (I) will be now described.

As shown in FIG. 1, an organic EL device 1 is formed by depositing, in sequence, a lower electrode 4, a light-emitting unit 6, an intermediate electrode 8, a light-emitting unit 10, and an upper electrode 12 on a substrate 2.

The intermediate electrode 8 includes metal layers 8a and 8b.

In the organic EL device 1, opposing electrodes can be driven independently.

For example, if a voltage is applied such that the lower electrode 4 serves as an anode and the intermediate electrode 8 serves as a cathode, the light-emitting unit 6 can be independently driven to emit light.

In such a case, the metal layer 8a is composed of a metal with a work function of 3 eV or lower, and the metal layer 8b is composed of a metal with a work function of 4 eV or higher.

If a voltage is applied such that the intermediate electrode 8 serves as an anode and the upper electrode 12 serves as a cathode, the light-emitting unit 10 can be independently driven to emit light.

Alternatively, the intermediate electrode 8 may serve as a cathode and the upper electrode 12 may serve as an anode. In such a case, a further metal layer (not shown) composed of a metal with a work function of 3 eV or lower is disposed on a side of the metal layer 8b, the side being adjacent to the upper electrode 12.

The metal layer(s) composed of a metal with a work function of 3 eV or lower may be disposed on either one or both sides of the metal layer composed of a metal with a work function of 4 eV or higher.

Non-limiting examples of the preferred layer structures of the light-emitting unit are listed below.

(i) Hole injection-transport layer/luminous layer/electron injection-transport layer (ii) Hole injection-transport layer/first luminous layer/second luminous layer/electron injection-transport layer (iii) Hole injection-transport layer/first luminous layer/intermediate layer/second luminous layer/electron injection-transport layer (iv) Hole injection-transport layer/luminous layer/hole blocking layer/electron injection-transport layer (v) Hole injection-transport layer/electron blocking layer/luminous layer/hole blocking layer/electron injection-transport layer (vi) Hole injection layer/hole transport layer/luminous layer/electron transport layer/electron injection layer (vii) Hole injection layer/hole transport layer/luminous layer/hole blocking layer/electron transport layer/electron injection layer (viii) Hole injection layer/hole transport layer/electron blocking layer/luminous layer/hole blocking layer/electron transport layer/electron injection layer According to the present invention, individual layers may be formed by any known thin-film forming process, for example, vacuum deposition, spin coating, casting, Langmuir Blodgett (LB) coating, ink jetting, spray coating, printing, or slot type coating.

According to the present invention, a luminous layer in a light-emitting unit may contain a phosphorescent material and a fluorescent material in combination, but is preferably composed of a phosphorescent material or a fluorescent material alone.

According to the present invention, a fluorescent layer and a phosphorescent layer are preferably host-dopant luminous layers.

The luminescent dopant may be contained in the luminous layer at a uniform concentration or may have a concentration distribution across the thickness of the luminous layer.

According to the present invention, light-emitting units with different structures may be used in combination, but the light-emitting units are preferably composed of layers with the same structure and materials, except the luminous layer, and more preferably have the same number of luminous layers. Such an organic EL device can be produced from a reduced number of materials, which is advantageous from the viewpoints of production costs and quality control. Such an organic EL device can be readily produced by a vapor deposition process in a single film deposition chamber.

For the aforementioned reasons, in a case of laminating white light-emitting units, the light-emitting units more preferably have the same layers, including the luminous layer, that are composed of the same materials.

In a case of laminating light-emitting units which respectively emit light of different colors, the light-emitting units preferably emit light of mutually complementary colors. For example, by disposing a blue light-emitting unit and a light-emitting unit which emits light of complementary color to blue, that is, yellow green, yellow, or orange, white light emission can be achieved.

The term "complementary colors" refers to a pair of colors that produce an achromatic color when they are mixed together. In other words, light emitted from materials which respectively emit light of mutually complementary colors are mixed to produce white light.

In addition to the blue luminous layer, the organic EL device preferably has a green luminous layer and a red luminous layer that are respectively disposed in any one of the light-emitting units, because such a structure allows white light emission with high color rendering index and adjustment of chromaticity in a wider range.

Alternatively, the light-emitting units may have a white luminous monolayer which contains blue, green, and red luminescent materials.

According to the present invention, preferred is an organic EL device that includes light-emitting units positioned opposite to each other across an intermediate electrode and respectively emitting light of different colors. Since individual light-emitting units can be driven independently, the color of light to be emitted can be varied. Such an organic EL device can be used in a wide range of lighting applications.

The organic EL device more preferably includes at least two intermediate electrodes and at least three light-emitting units because it can emit light of a wider variation of colors.

The organic EL device more preferably can emit white light by color mixing of light emitted from individual light-emitting units because it can emit light of a variation of colors, such as white light suitable for general lighting.

Colors of light emitted from the organic EL device and compounds of the present invention are determined based on measurements using a spectroradiometer CS-1000 (available from Konica Minolta, Inc.) by converting the measured values into the CIE chromaticity coordinates in accordance with "Shinpen Shikisai Kagaku Handbook (Handbook of Color Science)" (edited by The Color Science Association of Japan; published by University of Tokyo Press, 1985), page 108, FIG. 4.16.

As used herein, "white light" refers to light having chromatic deviation (Duv) from the blackbody radiation locus within the range of −20 to +20 at a correlated color temperature of within the range of 2500 to 7500 K. The definition of Duv (=1000 duv) is described in JIS Z 8725: 1999 "Methods for determining distribution temperature and color temperature or correlated color temperature of light sources."

According to the present invention, each luminous layer included in the light-emitting units may have any thickness, preferably within the range of 5 to 200 nm, more preferably within the range of 10 to 100 nm, from the viewpoints of uniformity of the film to be formed, to avoid application of an excessive high voltage at the time of light emission, and increase in stability of the color of emitted light with respect to a driving current.

<<Intermediate Electrode>>

The intermediate electrode of the present invention is electrically connected to an external power source, and at least one intermediate electrode has a metal layer composed of a metal with a work function of 3 eV or lower and a metal layer adjoining such a metal layer and composed of another metal with a work function of 4 eV or higher. The metal layer composed of a metal with a work function of 3 eV or lower and the metal layer of another metal with a work function of 4 eV or higher have a total thickness of 15 nm or less. The metal layer composed of a metal with a work function of 3 eV or lower is adjacent to an anode side of the second metal layer, when a voltage is applied across the intermediate electrode and the electrode opposing the intermediate electrode.

A structure of the metal layer composed of a metal with a work function of 3 eV or lower disposed on the metal layer composed of a metal with a work function of 4 eV or higher on a side adjacent to the electrode serving as an anode can reduce the driving voltage and increase the conductivity of the intermediate electrode. Such a structure further provides higher preservation stability of the organic EL device, in comparison with an organic EL device having an intermediate electrode composed of a layer of a metal with a work function of 3 eV or lower alone.

The intermediate electrode preferably has a thickness within the range of 5 to 10 nm.

An intermediate electrode having a thickness of 10 nm or less reduces light loss due to the optical absorption by the metal materials and thus prevents a decrease in luminous efficiency. An intermediate electrode having a thickness of 5 nm or more provides the intermediate electrode with high conductivity in a planar direction and thus superior electrode characteristics.

According to the present invention, the thickness of the metal layer composed of a metal with a work function of 3 eV or lower is preferably 3 nm or less in view of high preservation stability, and is more preferably 1.5 nm or less.

The thickness of the metal layer composed of a metal with a work function of 4 eV or higher is preferably 10 nm or less in view of the high luminous efficiency.

As used herein, "thickness of the intermediate electrode" is defined as "an average thickness" determined by dividing the mass of the deposited film per unit area of the intermediate electrode by the density of material for the intermediate electrode. Thus, the intermediate electrode may be partly thicker or thinner than the "average layer thickness."

Examples of a metal with a work function of 3 eV or lower include calcium (having a work function of 2.87 eV and a melting point of 1112.2 K), lithium (having a work function of 2.9 eV and a melting point of 453.7 K), sodium (having a work function of 2.75 eV and a melting point of 371 K), potassium (having a work function of 2.3 eV and a melting point of 336.9 K), cesium (having a work function of 2.14 eV and a melting point of 301.6 K), rubidium (having a work function of 2.16 eV and a melting point of 312.1 K), barium (having a work function of 2.7 eV and a melting point of 998.2 K), and strontium (having a work function of 2.59 eV and a melting point of 1042.2 K). Among these examples, preferred are lithium and calcium, which have a melting point of 400 K or higher under normal pressure, involve less risk of impairing the performance of the organic EL device, and are readily available.

Examples of a metal with a work function of 4 eV or higher include aluminum (having a work function of 4.28 eV) and silver (having a work function of 4.26 eV). Silver is particularly preferred, which causes less light loss due to optical absorption, that is, it has high reflectance.

The layer adjacent to the intermediate electrode preferably facilitate the acceptance of electrons and the injection of charge via the intermediate electrode between the light-emitting unit adjacent to the upper electrode and the light-emitting unit adjacent to the lower electrode.

One example layer with such ability is a mixed layer with enhanced charge transportability composed of a charge-transportable organic material doped with an inorganic material or an organic metal complex capable of oxidizing or reducing the organic material or forming a charge transfer complex with the organic material. Alternatively, a thin layer of an alkali metal compound or alkaline earth metal compound containing alkali metal atoms or alkaline earth metal atoms that has a low work function may be disposed.

According to the present invention, the organic EL device preferably has a layer containing a compound having a pyridine ring adjacent to one side of the metal layer composed of a metal with a work function of 3 eV or lower, that is opposite to the side adjacent to the metal layer composed of a metal with a work function of 4 eV or higher, from the viewpoints of increasing homogeneity and stability of these metal layers.

Although it is unknown how such an effect is caused as a result of disposing a layer containing a compound having a pyridine ring adjacent to a metal layer composed of a metal with a work function 3 eV or lower, a presumed factor is that migration of metal atoms is blocked due to the electrostatic interactions between atoms from the pyridine ring and the metal atoms, resulting in formation of a uniform film with less risk of thermal change in properties of the film.

<<Luminous Layer>>

Host compounds and dopants contained in the luminous layer will be now described.

(1) Phosphorescent Host Compound

A phosphorescent host compound employed in the present invention may have any structure, and typical examples thereof include compounds having a basic skeleton such as carbazole derivatives, triarylamine derivatives, aromatic borane derivatives, nitrogen-containing heterocyclic compounds, thiophene derivatives, furan derivatives, or oligoarylene compounds, and carboline derivatives or diazacarbazole (i.e., a ring in which at least one of the carbon atoms in the carboline ring of the carboline derivatives is replaced with a nitrogen atom) derivatives.

The phosphorescent compounds may be used alone or in combination.

The phosphorescent host compound used for the phosphorescent layer of the present invention is preferably represented by Formula (a):

[Chemical Formula 1]

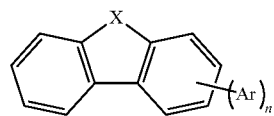

Formula (a)

where "X" represents NR', O, S, CR'R" or SiR'R", and R' and R" each represents a hydrogen atom or a substituent group. "Ar" represents an aromatic ring, and n represents an integer of 0 to 8.

Examples of the substituent group represented by each of R' and R" in "X" of Formula (a) include: alkyl groups, such as methyl, ethyl, propyl, isopropyl, tert-butyl, pentyl, hexyl, octyl, dodecyl, tridecyl, tetradecyl, and pentadecyl groups; cycloalkyl groups such as cyclopentyl and cyclohexyl groups; alkenyl groups such as vinyl, allyl, 1-propenyl, 2-butenyl, 1,3-butadienyl, 2-pentenyl, and isopropenyl groups; alkynyl groups, such as ethynyl and propargyl groups; aromatic hydrocarbon ring groups (also referred to as aromatic carbocyclic groups or aryl groups), such as phenyl, p-chlorophenyl, mesityl, tolyl, xylyl, naphthyl, anthryl, azulenyl, acenaphthenyl, fluorenyl, phenanthryl, indenyl, pyrenyl, and biphenylyl groups); heterocyclic aromatic ring groups, such as furyl, thienyl, pyridyl, pyridazinyl, pyrimidinyl, pyrazinyl, triazinyl, imidazolyl, pyrazolyl, thiazolyl, quinazolinyl, carbazolyl, carbolinyl, diazacarbazolyl (a group formed by substitution of any one of the carbon atoms forming the carboline ring of the carbolinyl group), and phthalazinyl groups; heterocyclic ring groups, such as pyrrolidyl, imidazolidyl, morpholyl, and oxazolidyl groups; alkoxy groups, such as methoxy, ethoxy, propyloxy, pentyloxy, hexyloxy, octyloxy, and dodecyloxy groups; cycloalkoxy groups, such as cyclopentyloxy and cyclohexyloxy groups; aryloxy groups, such as phenoxy and naphthyloxy groups; alkylthio groups, such as methylthio, ethylthio, propylthio, pentylthio, hexylthio, octylthio, and dodecylthio groups; cycloalkylthio groups, such as cyclopentylthio and cyclohexylthio groups; arylthio groups such as phenylthio and naphthylthio groups; alkoxycarbonyl groups, such as meth yloxycarbonyl, ethyloxycarbonyl, butyloxycarbonyl, octyloxycarbonyl, and dodecyloxycarbonyl groups; aryloxycarbonyl groups, such as phenyloxycarbonyl, and naphthyloxycarbonyl groups; sulfamoyl groups, such as aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl groups; acyl groups, such as acetyl, ethylcarbonyl, propylcarbonyl, pentylcarbonyl, cyclohexyl carbonyl, octyl carbonyl, 2-ethylhexyl carbonyl, dodecylcarbonyl, phenylcarbonyl, naphthylcarbonyl, and pyridylcarbonyl groups; acyloxy groups, such as acetyloxy, ethylcarbonyloxy, butylcarbonyloxy, octylcarbonyloxy, dodecylcarbonyloxy, and phenylcarbonyloxy groups; amide groups, such as methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, and naphthylcarbonylamino groups; carbamoyl groups, such as aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl groups; ureido groups such as methylureido, ethylureido, pentylureido, cyclohexylureido, octylureido, dodecylureido, phenylureido, naphthylureido, and 2-pyridylaminoureido groups; sulfinyl groups such as methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl groups; alkylsulfonyl groups, such as methylsulfonyl, ethylsulfonyl, butylsulfonyl, cyclohexylsulfonyl, 2-ethylhexylsulfonyl, and dodecylsulfonyl groups; arylsulfonyl groups; heteroarylsulfonyl groups, such as phenylsulfonyl, naphthylsulfonyl, and 2-pyridylsulfonyl groups; amino groups, such as amino, ethylamino, dimethylamino, butylamino, cyclopentylamino, 2-ethylhexylamino, dodecylamino, anilino, naphthylamino, and 2-pyridylamino groups; halogen atoms, such as fluorine, chlorine, and bromine atoms; fluorohydrocarbon groups, such as fluoromethyl, trifluoromethyl, pentafluoroethyl, and pentafluorophenyl groups; cyano groups; nitro groups; hydroxy groups; mercapto groups; silyl groups, such as trimethylsilyl, triisopropylsilyl, triphenylsilyl, and phenyldiethylsilyl groups; and phosphono groups.

These substituent groups may further be substituted by the above substituent groups. These substituent groups may also be bonded to each other to form a ring.

In Formula (a), "X" is preferably NR' or O, and particularly preferred examples of R' include aromatic hydrocarbon ring groups and heterocyclic aromatic ring groups.

Examples of the aromatic ring represented by "Ar" in Formula (a) include an aromatic hydrocarbon ring and a heterocyclic aromatic ring. The aromatic ring may be monocyclic, fused, or unsubstituted, or may have the substituent groups listed below.

Examples of the aromatic hydrocarbon ring represented by "Ar" in Formula (a) include a benzene, biphenyl, naphthalene, azulene, anthracene, phenanthrene, pyrene, chrysene, naphthacene, triphenylene, o-terphenyl, m-terphenyl, p-terphenyl, acenaphthene, coronene, fluorene, fluoranthrene, naphthacene, pentacene, perylene, pentaphene, picene, pyrene, pyranthrene, and anthraanthrene rings. These rings may further have a substituent group.

Examples of the heterocyclic aromatic ring represented by "Ar" in Formula (a) include furan, dibenzofuran, thiophene, oxazole, pyrrole, pyridine, pyridazine, pyrimidine, pyrazine, triazine, benzimidazole, oxadiazole, triazole, imidazole, pyrazole, triazole, indole, indazole, benzimidazole, benzothiazole, benzoxazole, quinoxaline, quinazoline, cinnoline, quinoline, isoquinoline, phthalazine, naphthyridine, carbazole, carboline, and diazacarbazole (i.e., a ring in which one of the carbon atoms in the carboline ring is further replaced with a nitrogen atom) rings. These rings may further have a substituent group.

Among the rings described above, the usable aromatic ring represented by "Ar" in Formula (a) is preferably a carbazole, carboline, dibenzofuran, and benzene rings. Among them, carbazole, carboline, and benzene rings are particularly preferred. Among the rings described above, a benzene ring having a substituent group is preferred and a benzene ring having a carbazolyl group is particularly preferred.

The aromatic ring represented by "Ar" in Formula (a) is preferably a fused ring composed of three or more rings described below. Specific examples of the aromatic hydrocarbon fused ring composed of three or more rings include naphthacene, anthracene, tetracene, pentacene, hexacene, phenanthrene, pyrene, benzopyrene, benzoazulene, chrysene, benzochrysene, acenaphthene, acenaphthylene, triphenylene, coronene, benzocoronene, hexabenzocoronene, fluorene, benzofluorene, fluoranthene, perylene, naphthoperylene, pentabenzoperylene, benzoperylene, pentaphene, picene, pyranthrene, coronene, naphthocoronene, ovalene, and anthraanthrene rings. These rings may further have a substituent group.

Specific examples of the heterocyclic aromatic fused ring composed of three or more rings include an acridine, benzoquinoline, carbazole, carboline, phenazine, phenanthridine, phenanthroline, carboline, cyclazine, quindoline, thebenidine, quinindoline, triphenodithiazine, triphenodioxazine, phenanthrazine, anthrazine, perimidine, diazacarbazole (i.e., a ring in which any one of the carbon atoms in the carboline ring is replaced with a nitrogen atom), phenanthroline, dibenzofuran, dibenzothiophene, naphthofuran, naphthothiophene, benzodifuran, benzodithiophene, naphthodifuran, naphthodithiophene, anthrafuran, anthradifuran, anthrathiophene, anthradithiophene, thianthrene, phenoxathiin, and thiophanthrene (naphthothiophene) rings. These rings may further have a substituent group.

The substituent groups which may be included in the aromatic ring represented by "Ar" in Formula (a) have the same definition as that of R' and R".

In Formula (a), n represents an integer of 0 to 8, preferably 0 to 2. In particular, if "X" is O or S, n is preferably 1 or 2.

Non-limiting specific examples of the phosphorescent host compounds represented by Formula (a) will be shown below.

[Chemical Formula 2]

1-1

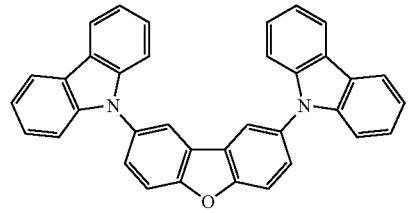

1-2

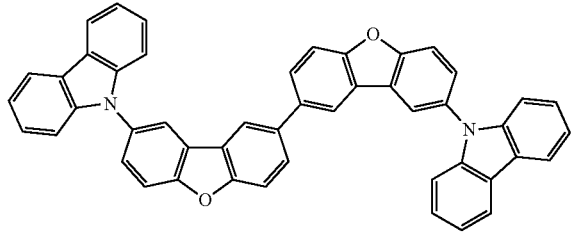

1-3

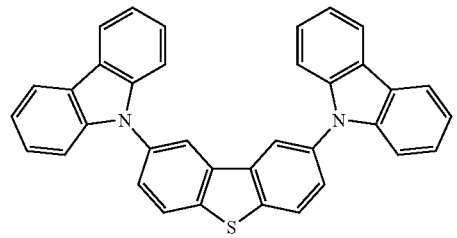

1-4

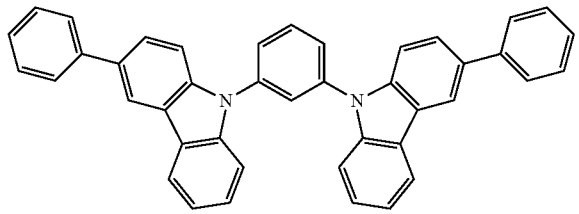

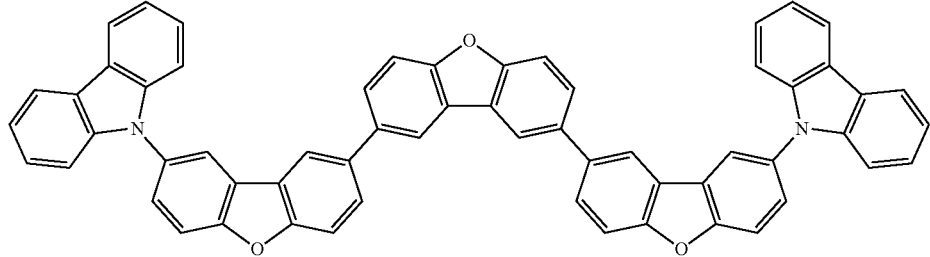
1-5
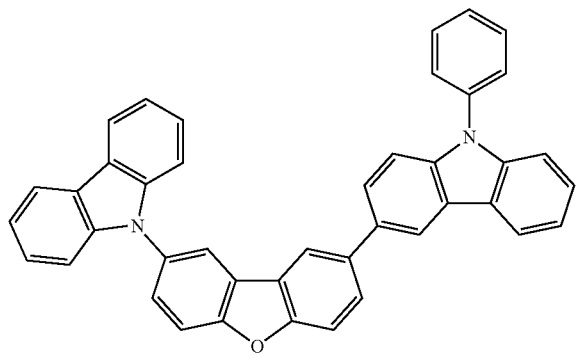
1-6
[Chemical Formula 3]
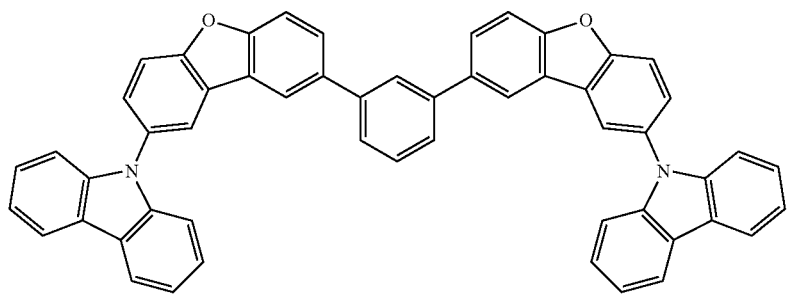
1-7
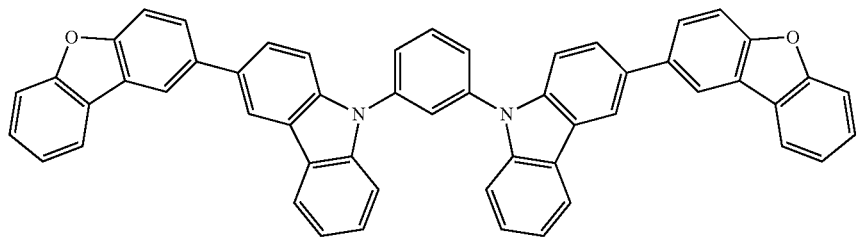
1-8
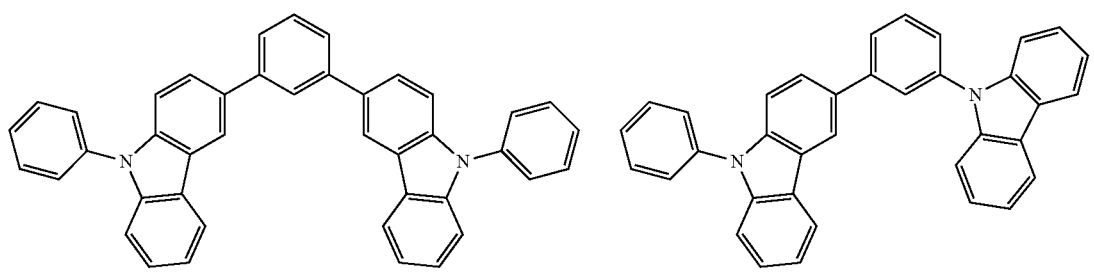
1-9     1-10

-continued
1-11
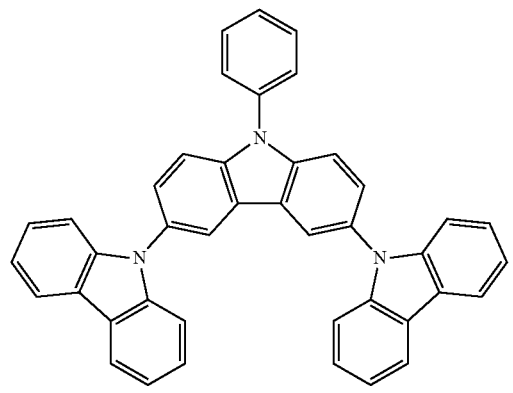
1-12
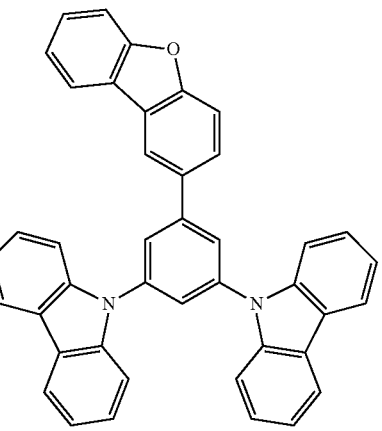
[Chemical Formula 4]
1-13
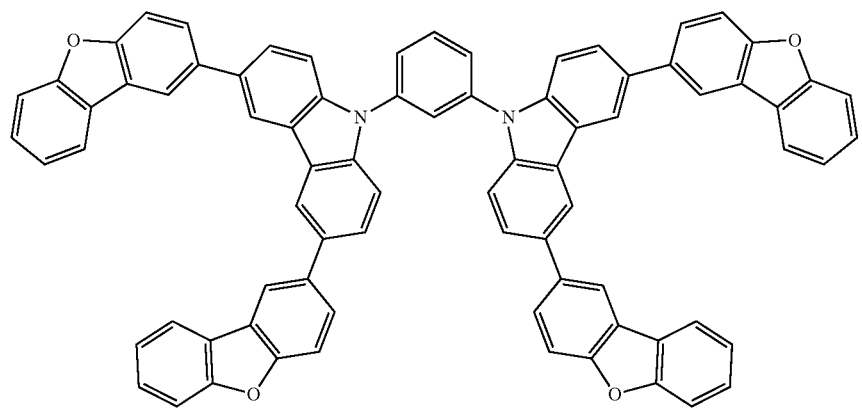
1-14
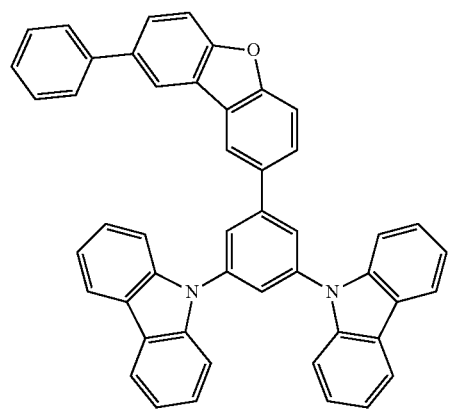
1-15
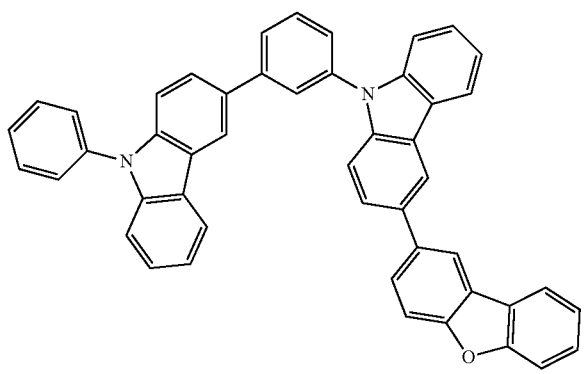
1-16
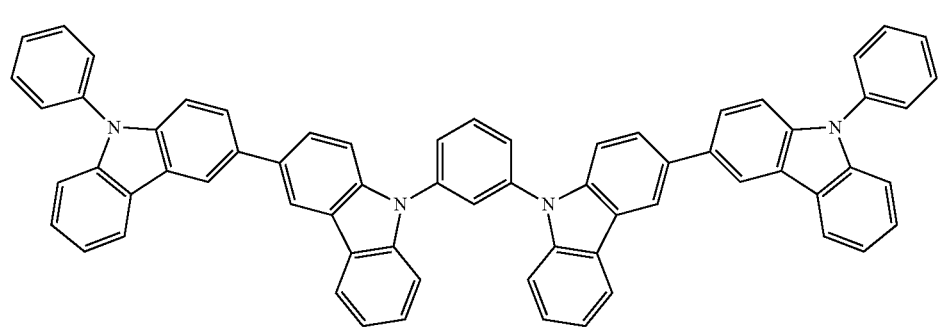

-continued
1-17
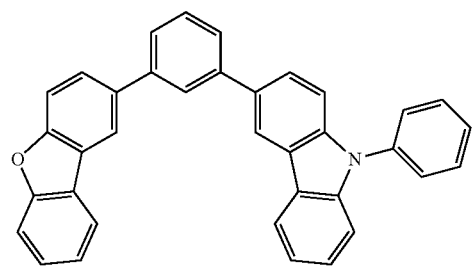
1-18
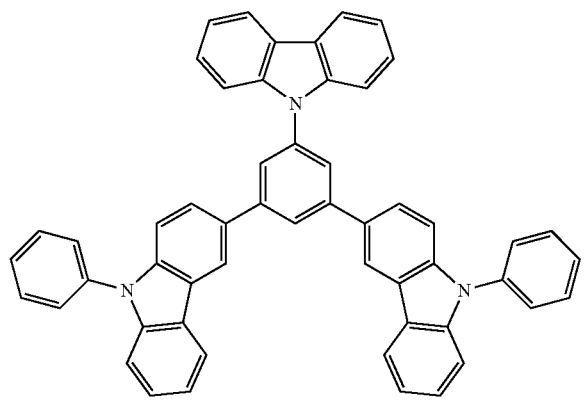
[Chemical Formula 5]
1-19
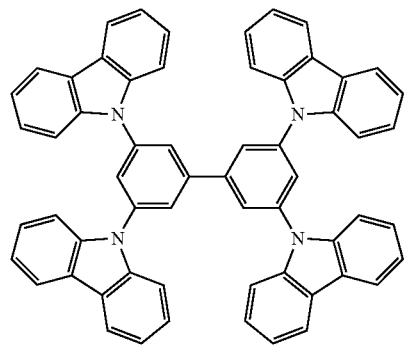
1-20
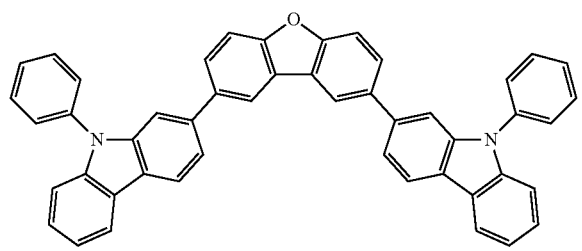
1-21
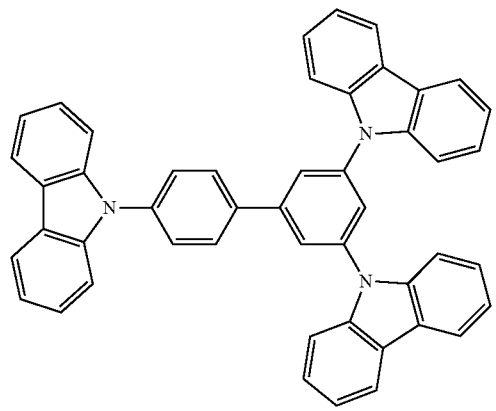
1-22
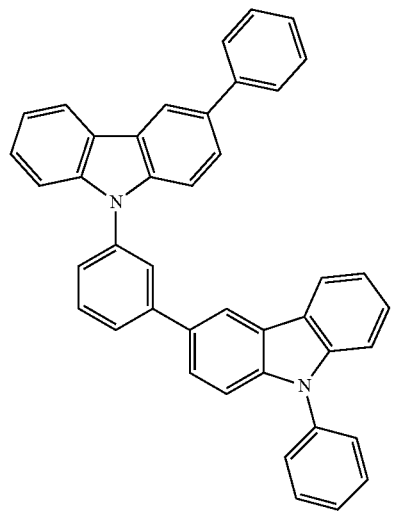

1-23
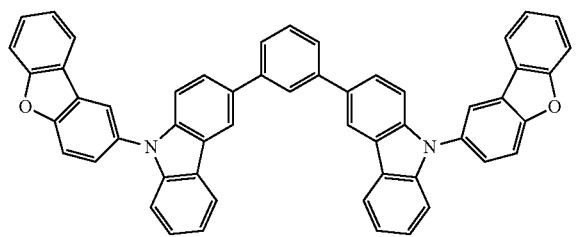
1-24
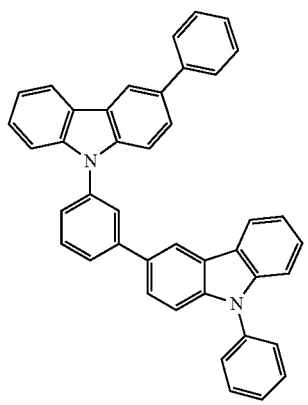
[Chemical Formula 6]
1-25
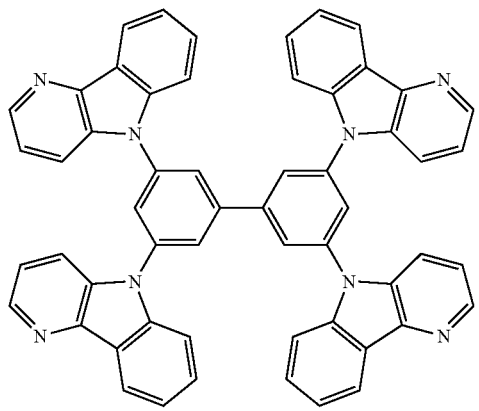
1-26
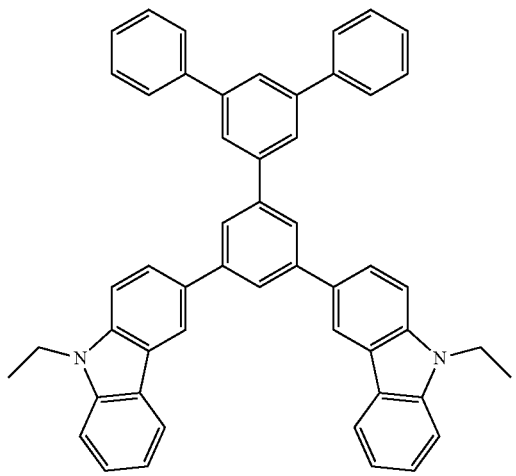
1-27
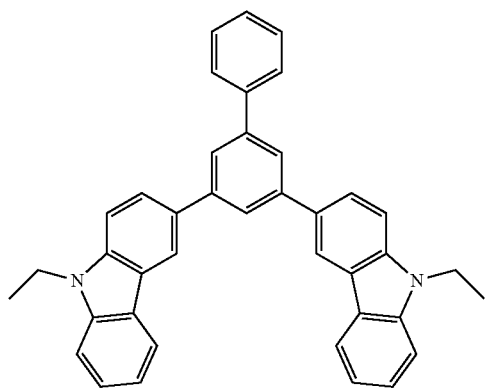
1-28
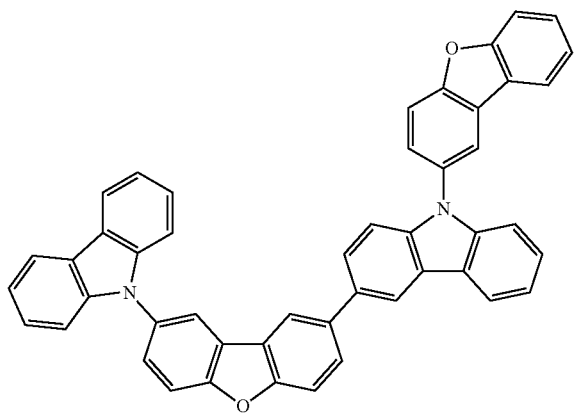

-continued
1-29
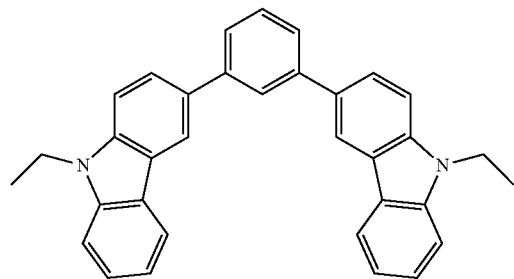
1-30
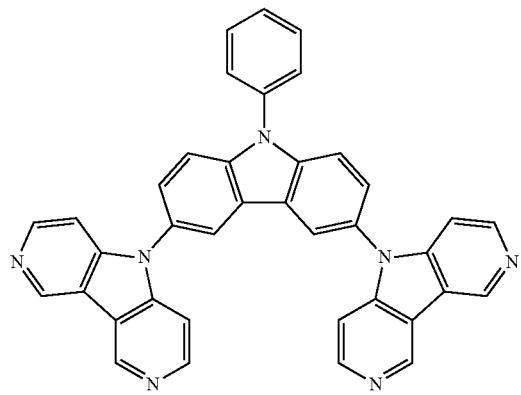
[Chemical Formula 7]
1-31
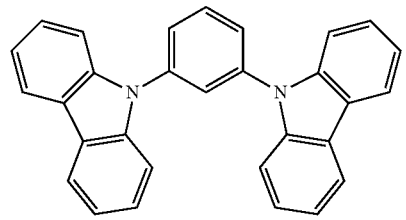
1-32
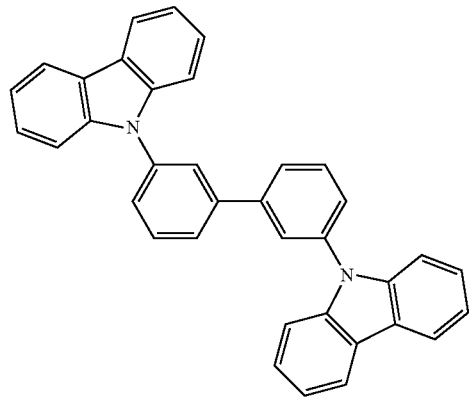
1-33
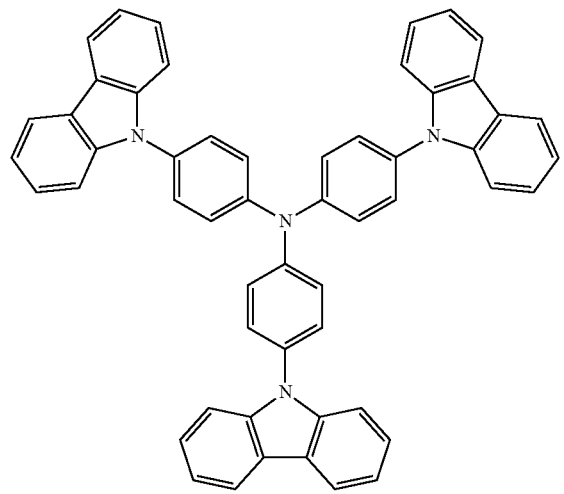
1-34
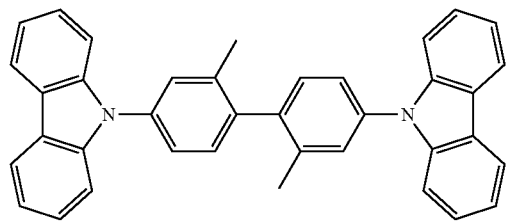
1-35
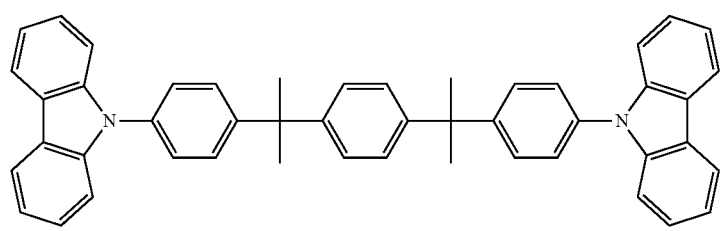

[Chemical Formula 8]
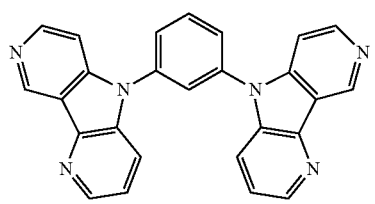
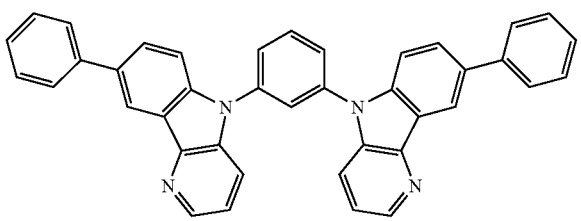
1-36
1-37
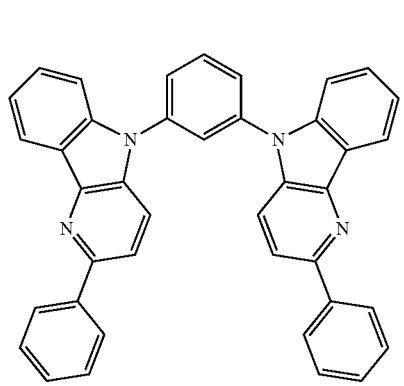
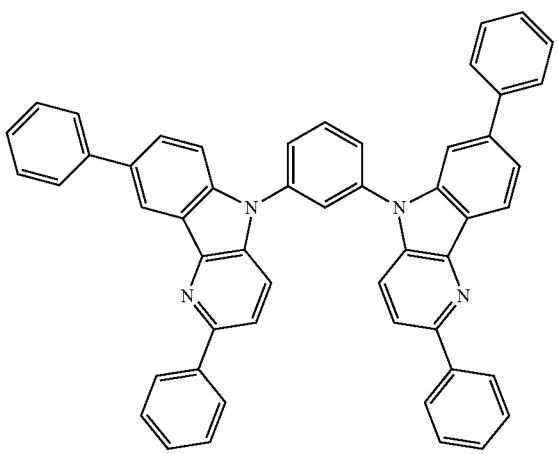
1-38
1-39
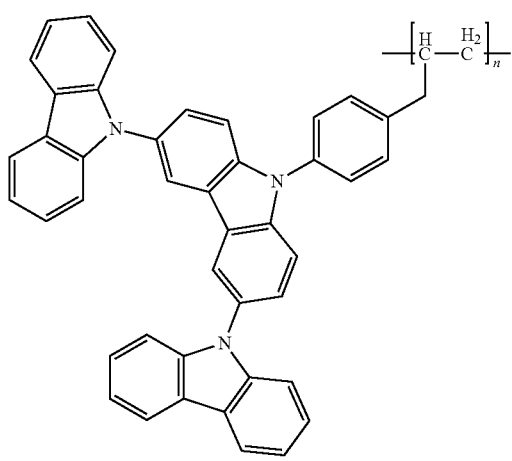
1-40

[Chemical Formula 9]

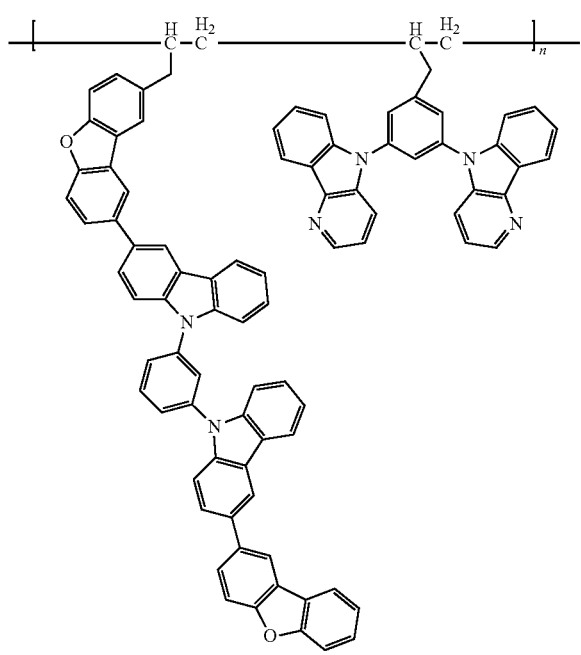

1-41

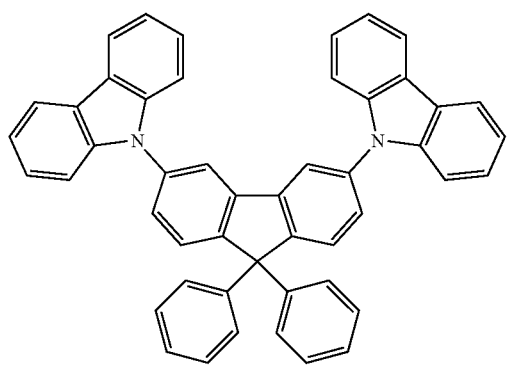

1-42

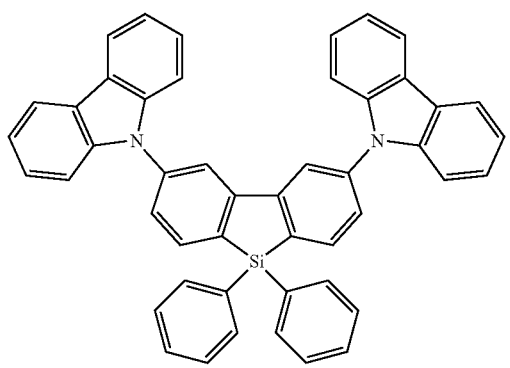

1-43

The phosphorescent host compound used in the present invention may be any compound having a low molecular weight, a polymer having repeating units, or a low-molecular-weight compound having a polymerizable group, such as a vinyl group or an epoxy group (vapor deposition polymerizable luminous host).

The phosphorescent host compound preferably has hole and electron transportability, can prevent the shift of emission toward a longer wavelength, and has a high glass transition temperature (Tg). In the present invention, compounds having a glass transition temperature of 90° C. or higher are preferred, and compounds having a glass transition temperature of 130° C. or higher are preferred more, because such compounds can provide excellent properties.

The glass transition temperature (Tg) herein is determined by differential scanning calorimetry (DSC) in accordance with JIS K 7121.

Specific examples of preferred conventionally known host compounds include compounds described in the following patent literatures: Japanese Laid-Open Patent Application Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837.

The phosphorescent host compound preferably has a minimum triplet excitation energy ($T_1$) of above 2.7 eV for the high luminous efficiency of the resulting device.

The minimum triplet excitation energy in the present invention is determined by measuring a phosphorescent spectrum of a host compound dissolved in a solvent at a liquid nitrogen temperature. A peak energy of the phosphorescent emission band corresponding to the transition between the lowest vibrational levels is referred to as the minimum triplet excitation energy.

(2) Phosphorescent Dopant

The phosphorescent dopant applicable to the present invention can be selected from known phosphorescent dopants, for example, complex compounds containing a metal belonging to Groups 8 to 10 in the periodic table, preferably iridium, osmium, and platinum compounds (platinum-group complex compounds) and rare earth complexes. Among these compounds, iridium compounds are most preferred.

In production of an organic EL device according to the present invention, a luminescent material required for emission of light in at least the green, yellow, and red regions is preferably a phosphorescent material because a luminescent material provides a device with high luminous efficiency and a prolonged lifetime.

(Partial Structures Represented by Formulae (A) to (C))

If a blue phosphorescent dopant is used in the present invention, the blue phosphorescent dopant can be appropriately selected from known materials applicable for a luminous layer of an organic EL device, but preferably has at least one of the partial structures represented by following Formulae (A) to (C).

[Chemical Formula 10]

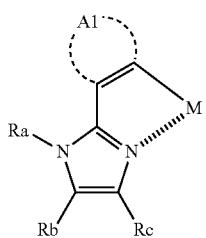

Formula (A)

In Formula (A), "Ra" represents a hydrogen atom, an aliphatic group, an aromatic group, or a heterocyclic group, "Rb" and "Rc" each represent a hydrogen atom or a substituent group, "A1" represents a residue necessary for forming an aromatic ring or heterocyclic aromatic ring, and "M" represents Ir or Pt.

[Chemical Formula 11]

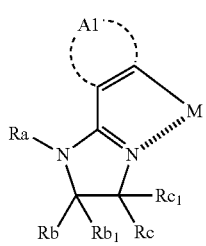

Formula (B)

In Formula (B), "Ra" represents a hydrogen atom, an aliphatic group, an aromatic group, or a heterocyclic group, "Rb," "Rc," "Rb$_1$" and "Rc$_1$" each represent a hydrogen atom or a substituent group, "A1" represents a residue necessary for forming an aromatic ring or heterocyclic aromatic ring, and "M" represents Ir or Pt.

[Chemical Formula 12]

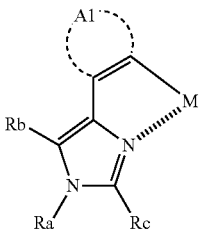

Formula (C)

In Formula (C), "Ra" represents a hydrogen atom, an aliphatic group, an aromatic group, or a heterocyclic group, "Rb" and "Rc" each represent a hydrogen atom or a substituent group, "A1" represents a residue necessary for forming an aromatic ring or heterocyclic aromatic ring, and "M" represents Ir or Pt.

Examples of the aliphatic group represented by "Ra" in Formulae (A) to (C) include alkyl groups, such as methyl, ethyl, propyl, butyl, pentyl, isopentyl, 2-ethylhexyl, octyl, undecyl, dodecyl, and tetradecyl groups, and cycloalkyl groups, such as cyclopentyl and cyclohexyl groups. Examples of the aromatic group represented by "Ra" in Formulae (A) to (C) include phenyl, tolyl, azulenyl, anthranyl, phenanthryl, pyrenyl, chrysenyl, naphthacenyl, o-terphenyl, m-terphenyl, p-terphenyl, acenaphthenyl, coronenyl, fluorenyl, and perylenyl groups. Examples of the heterocyclic group represented by "Ra" in Formulae (A) to (C) include pyrrolyl, indolyl, furyl, thienyl, imidazolyl, pyrazolyl, indolizinyl, quinolinyl, carbazolyl, indolinyl, thiazolyl, pyridyl, pyridazinyl, thiadiazinyl, oxadiazolyl, benzoquinolinyl, thiadiazolyl, pyrrolothiazolyl, pyrrolopyridazinyl, tetrazolyl, oxazolyl, and chromanyl groups. Each of these groups may have a substituent group.

Examples of the substituent groups represented by "Rb," "Rc," "Rb$_1$" and "Rc$_1$" in Formulae (A) to (C) include: alkyl groups, such as methyl, ethyl, propyl, isopropyl, tert-butyl, pentyl, hexyl, octyl, dodecyl, tridecyl, tetradecyl, and pentadecyl groups; cycloalkyl groups, such as cyclopentyl and cyclohexyl groups; alkenyl groups, such as vinyl and allyl groups; alkynyl groups, such as ethynyl and propargyl groups; aryl groups, such as phenyl and naphthyl groups; heterocyclic aromatic ring groups, such as furyl, thienyl, pyridyl, pyridazinyl, pyrimidinyl, pyradinyl, triazinyl, imidazolyl, pyrazolyl, thiazolyl, quinazolinyl, and phthalazinyl groups; heterocyclic groups, such as pyrrolidyl, imidazolidyl, morpholyl, and oxazolidyl groups; alkoxy groups, such as methoxy, ethoxy, propyloxy, pentyloxy, hexyloxy, octyloxy, and dodecyloxy groups; cycloalkoxy groups, such as cyclopentyloxy and cyclohexyloxy groups; aryloxy groups, such as phenoxy and naphthyloxy groups; alkylthio groups, such as methylthio, ethylthio, propylthio, pentylthio, hexylthio, octylthio, and dodecylthio groups; cycloalkylthio groups, such as cyclopentylthio and cyclohexylthio groups; arylthio groups, such as phenylthio and naphthylthio groups; alkoxycarbonyl groups, such as methyloxycarbonyl, ethyloxycarbonyl, butyloxycarbonyl, octyloxycarbonyl, and dodecyloxycarbonyl groups; aryloxycarbonyl groups, such as phenyloxycarbonyl and naphthyloxycarbonyl groups; sulfamoyl groups, such as aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl groups; acyl groups, such as acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, and pyridylcarbonyl groups; acyloxy groups, such as acetyloxy, ethylcarbonyloxy, butylcarbonyloxy, octylcarbonyloxy, dodecylcarbonyloxy, and phenylcarbonyloxy groups; amido groups, such as methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, and naphthylcarbonylamino groups; carbamoyl groups, such as aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl groups; ureido groups, such as methylureido, ethylureido, pentylureido, cyclohexylureido, octylureido, dodecylureido, phenylureido, naphthylureido, and a 2-pyridylaminoureido groups; sulfinyl groups, such as methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl groups; alkylsulfonyl groups, such as methylsulfonyl, ethylsulfonyl, butylsulfonyl, cyclohexylsulfonyl, 2-ethylhexylsulfonyl, and dodecylsulfonyl groups; arylsulfonyl groups, such as phenylsulfonyl, naphthylsulfonyl, and 2-pyridylsulfonyl groups; amino groups, such as amino, ethylamino, dimethylamino, butylamino, cyclopentylamino, 2-ethylhexylamino, dodecylamino, anilino, naphthylamino, and 2-pyridylamino groups; halogen atoms, such as fluorine, chlorine, and bromine atoms; fluorohydrocarbon groups, such as fluoromethyl, trifluoromethyl, pentafluoroethyl, and pentafluorophenyl groups; cyano groups; nitro groups; hydroxy groups; mercapto groups; and silyl groups, such as trimethylsilyl, triisopropylsilyl, triphenylsilyl, and phenyldiethylsilyl groups. These substituent groups may further be substituted by the above substituent groups.

Examples of the aromatic ring represented by "A1" in Formulae (A) to (C) include a benzene, biphenyl, naphthalene, azulene, anthracene, phenanthrene, pyrene, chrysene, naphthacene, triphenylene, o-terphenyl, m-terphenyl, p-terphenyl, acenaphthene, coronene, fluorene, fluoranthrene, naphthacene, pentacene, perylene, pentaphene, picene, pyrene, pyranthrene, and anthraanthrene rings. Examples of the heterocyclic aromatic ring represented by "A1" in Formulae (A) to (C) include a furan, thiophene, pyridine, pyridazine, pyrimidine, pyrazine, triazine, benzimidazole, oxadiazole, triazole, imidazole, pyrazole, triazole, indole, benzimidazole, benzothiazole, benzoxazole, quinoxaline, quinazoline, phthalazine, carbazole, carboline, and diazacarbazole (i.e., a ring in which one of the carbon atoms in the carboline ring is further replaced with a nitrogen atom) rings.

In Formulae (A) to (C), "M" represents Ir or Pt. In particular, M is preferably Ir.

The structures represented by Formulae (A) to (C) are partial structures, and each requires a ligand corresponding to the valence of the central metal for forming a complete structure to serve as a luminescent dopant. Specific examples of the ligand include halogens, such as fluorine, chlorine, bromine, and iodine atoms; aryl groups, such as phenyl, p-chlorophenyl, mesityl, tolyl, xylyl, biphenyl, naphthyl, anthryl, and phenanthryl groups; alkyl groups, such as methyl, ethyl, isopropyl, hydroxyethyl, methoxymethyl, trifluoromethyl, and t-butyl groups; alkyloxy groups; aryloxy groups; alkylthio groups; arylthio groups; heterocyclic aromatic ring groups, such as furyl, thienyl, pyridyl, pyridazinyl, pyrimidinyl, pyradinyl, triazinyl, imidazolyl, pyrazolyl, thiazolyl, quinazolinyl, carbazolyl, carbolinyl, and phthalazinyl groups; and the partial structures of Formulae (A) to (C) with the metal removed.

The phosphorescent dopant of the present invention is preferably a tris compound completed by three partial structures of Formulae (A) to (C).

Non-limiting examples of compounds having partial structures of Formulae (A) to (C) used as the blue phosphorescent dopant of the present invention will be listed below.

[Chemical Formula 13]

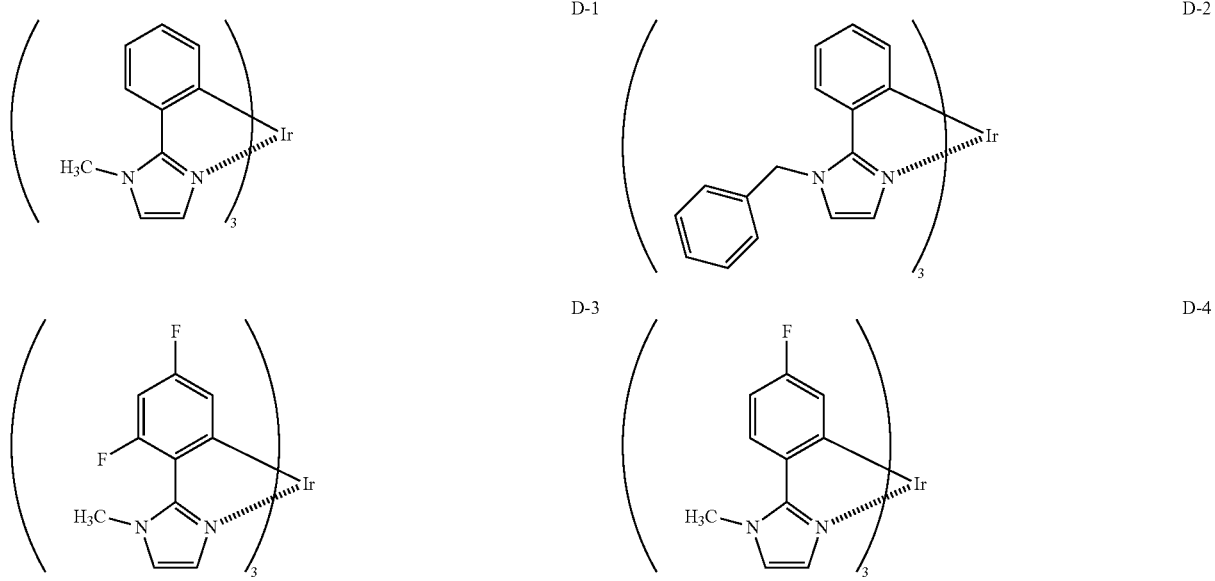

-continued
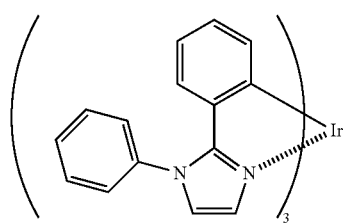
D-5
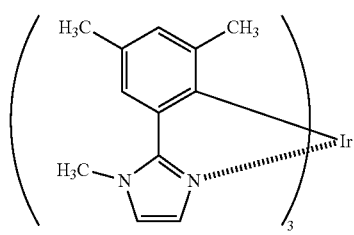
D-6
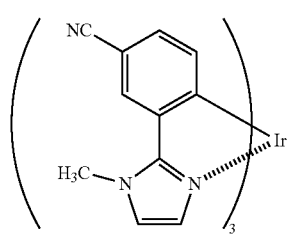
D-7
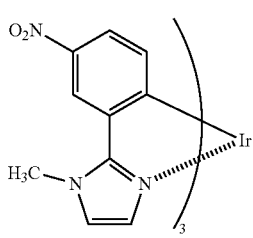
D-8
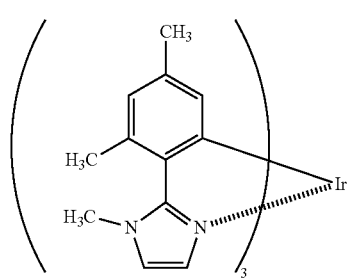
D-9
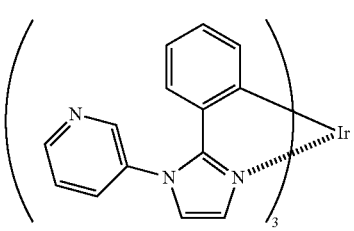
D-10
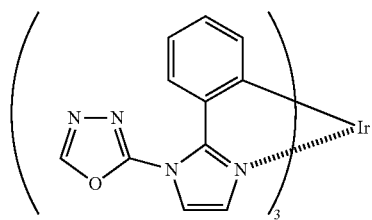
D-11
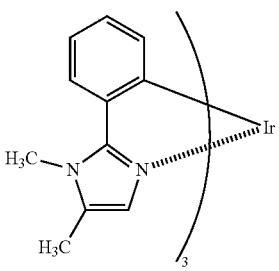
D-12
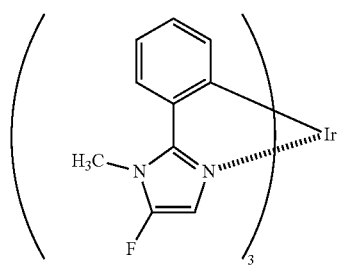
D-13
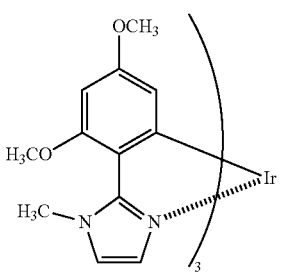
D-14
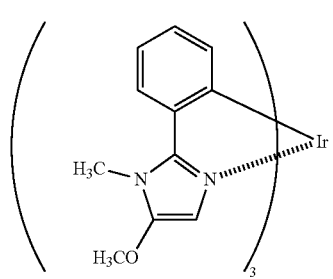
D-15

[Chemical Formula 14]
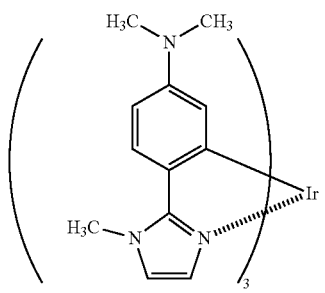 D-16
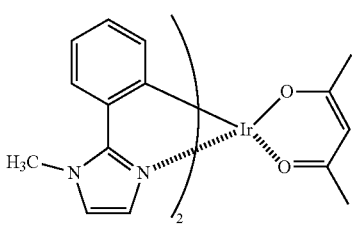 D-17
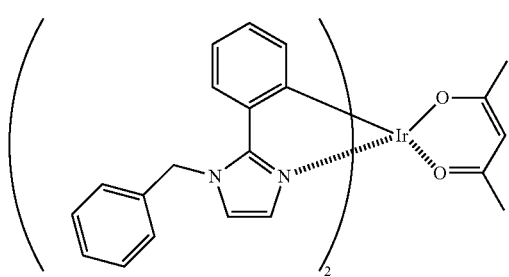 D-18
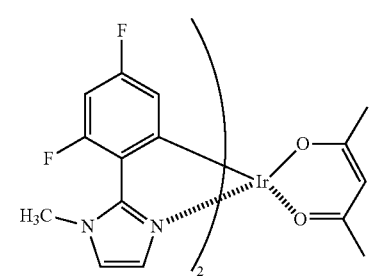 D-19
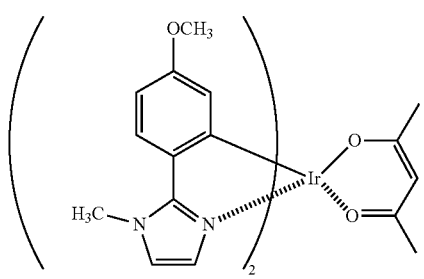 D-20
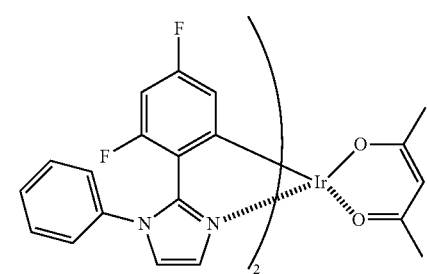 D-21
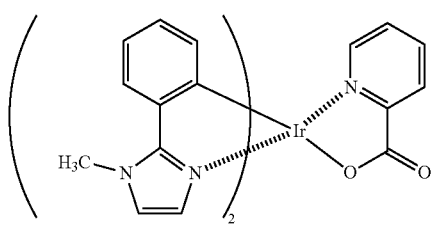 D-22
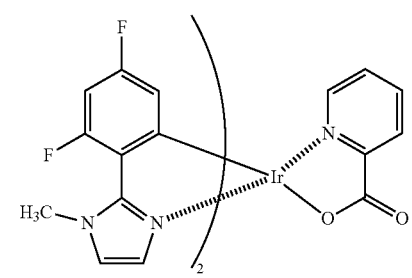 D-23
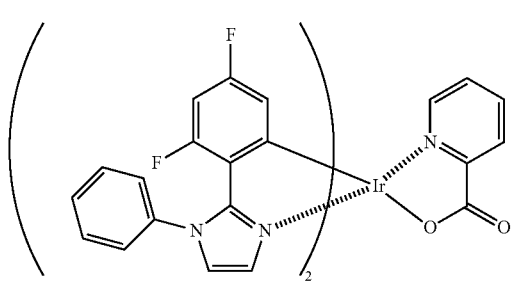 D-24
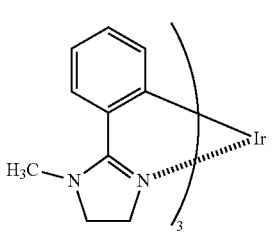 D-25

[Chemical Formula 15]
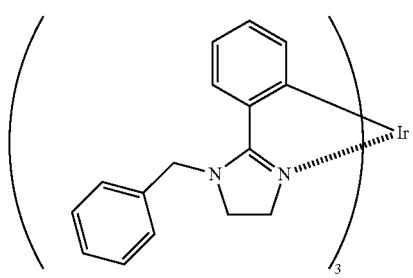
D-26
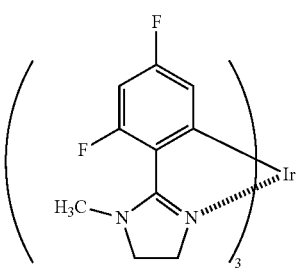
D-27
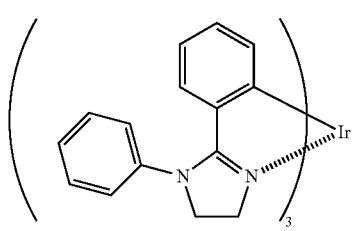
D-28
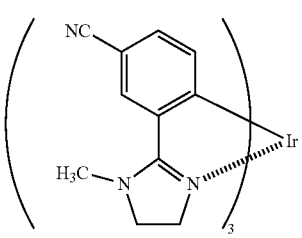
D-29
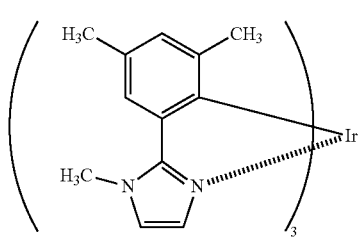
D-30
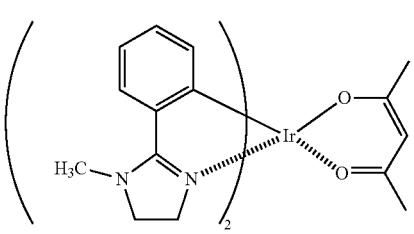
D-31
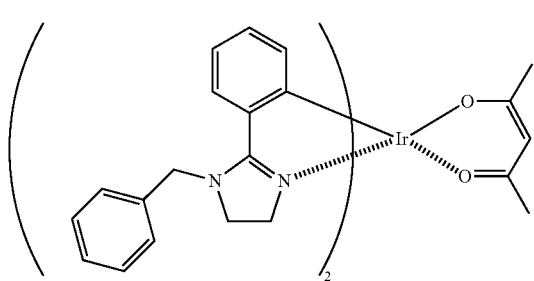
D-32
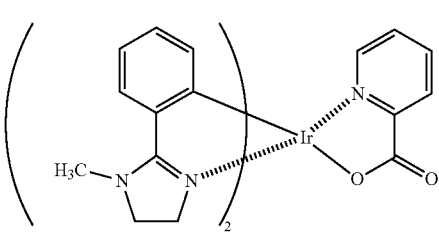
D-33
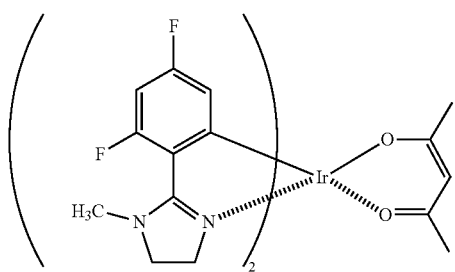
D-34
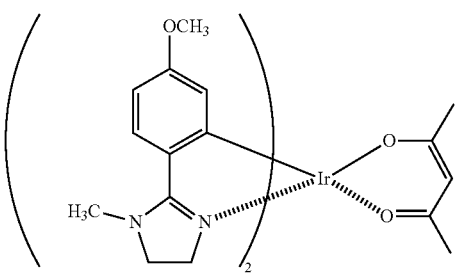
D-35
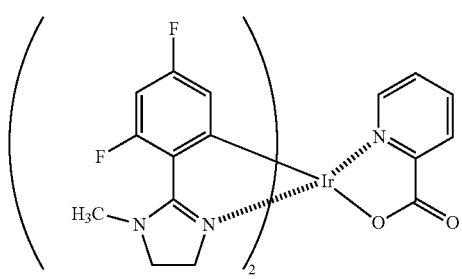
D-36
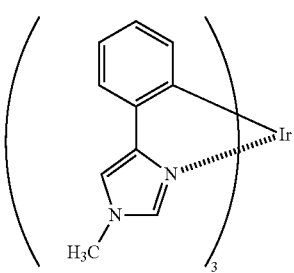
D-37

-continued
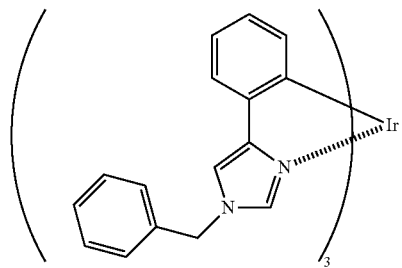
[Chemical Formula 16]
D-38
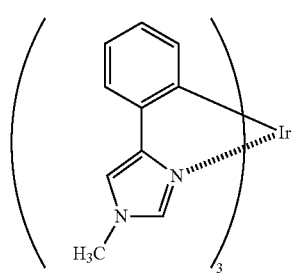
D-39
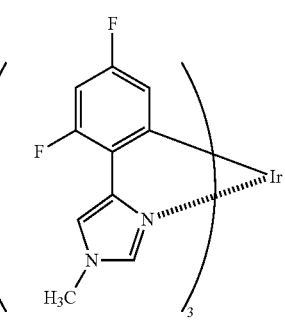
D-40
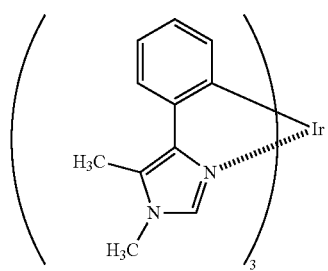
D-41
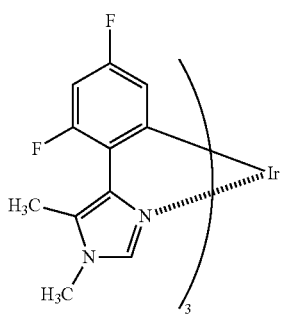
D-42
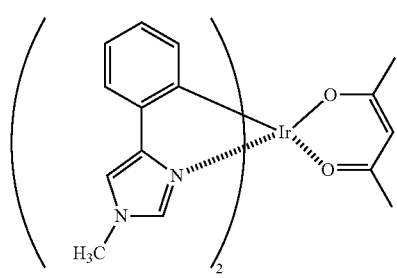
D-43
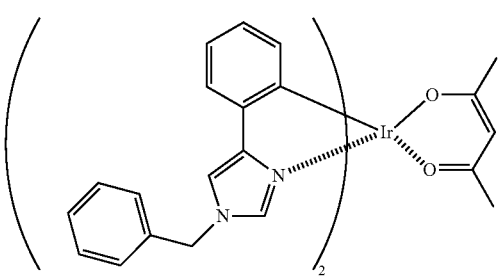
D-44
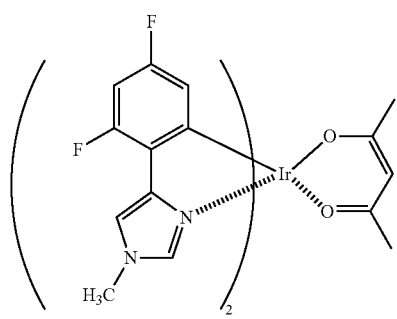
D-45
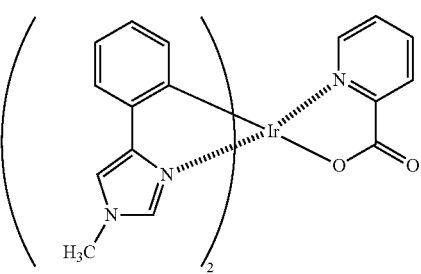
D-46

-continued
D-47
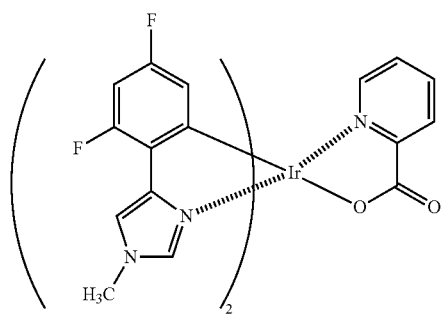
D-48
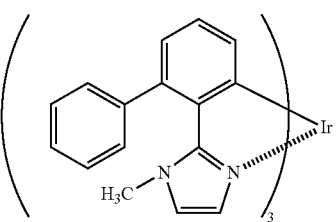
D-49
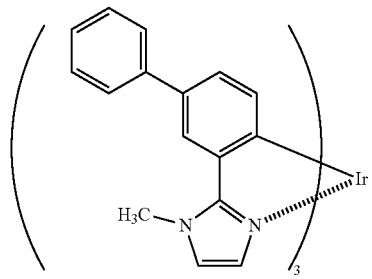
D-50
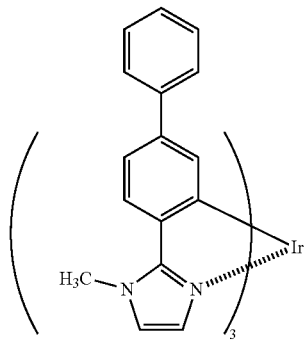
D-51
[Chemical Formula 17]
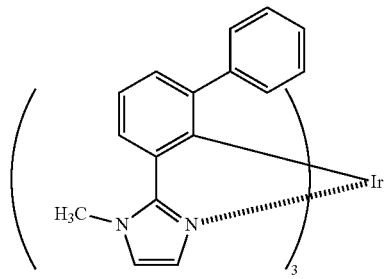
D-52
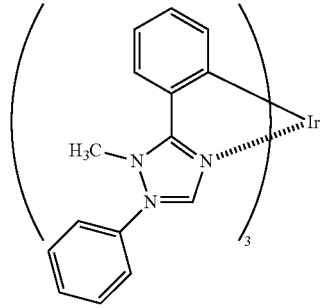
D-53
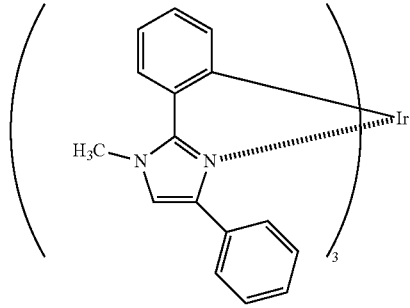
D-54
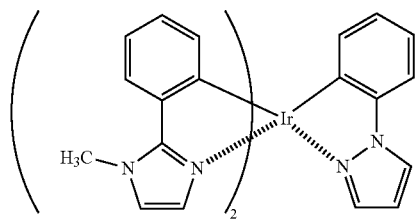
D-55
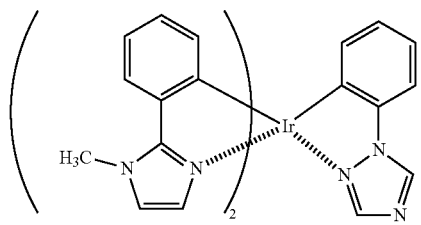

-continued
D-56
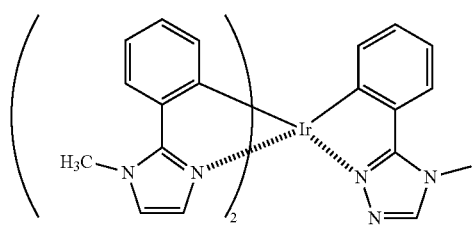
D-57
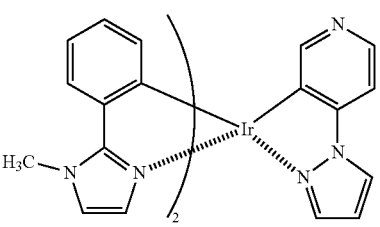
D-58
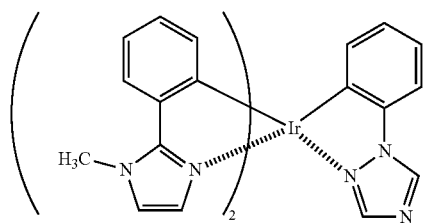
D-59
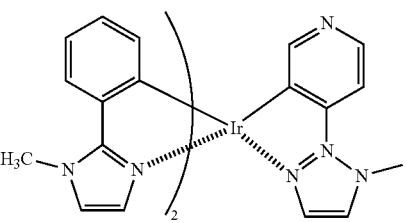
D-60
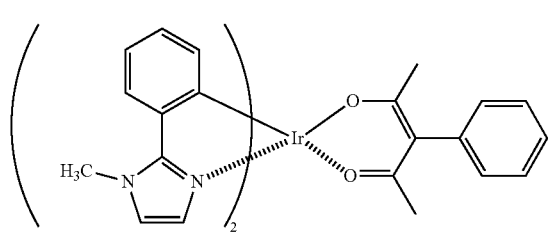
D-61
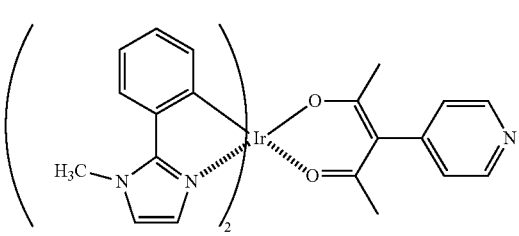
D-62
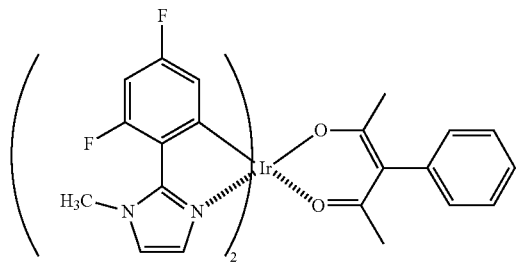
[Chemical Formula 18]
D-63
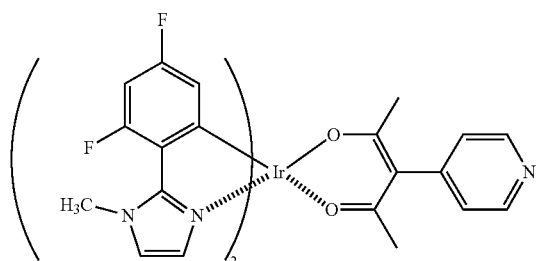
D-64
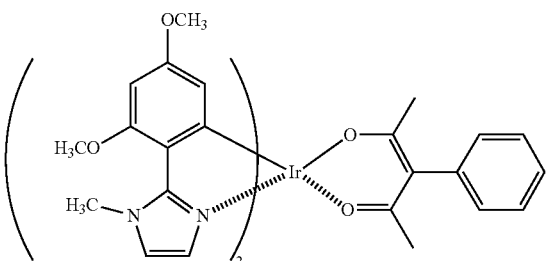
D-65
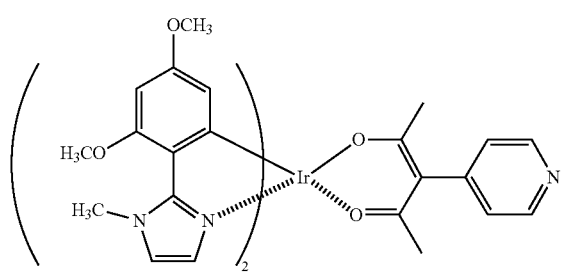
D-66
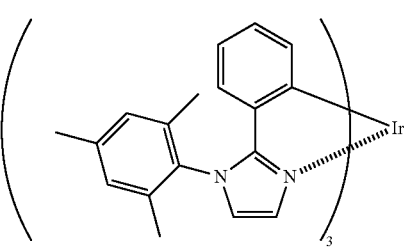

[Chemical Formula 19]
D-67
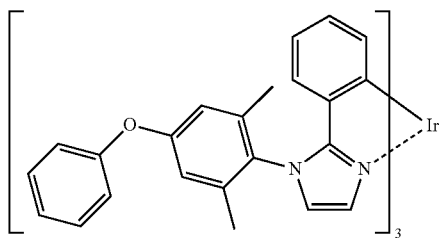
D-68
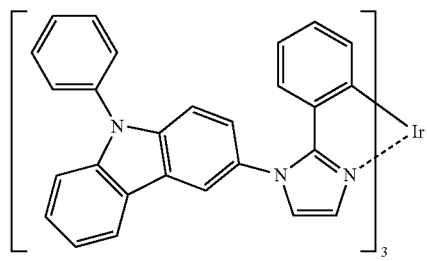
D-69
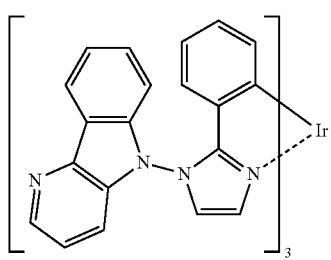
D-70
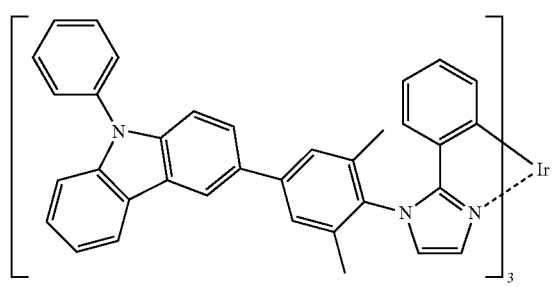
D-71
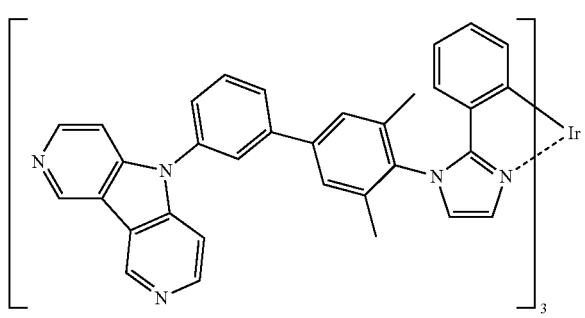
D-72
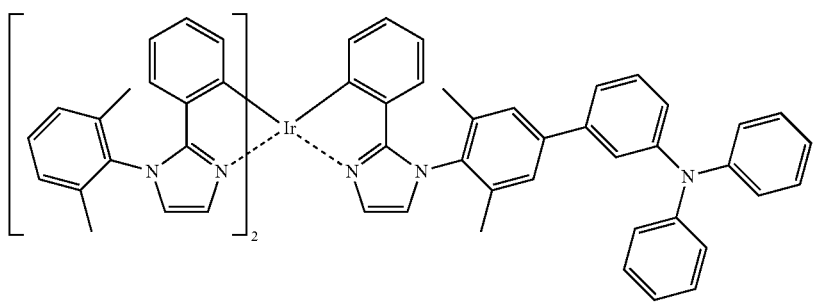
D-73
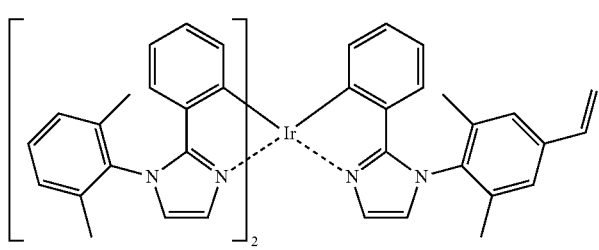

[Chemical Formula 20]
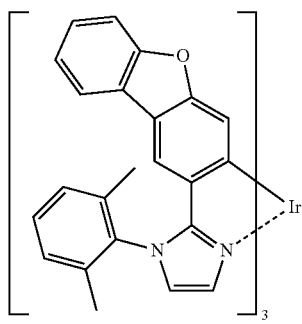
D-74
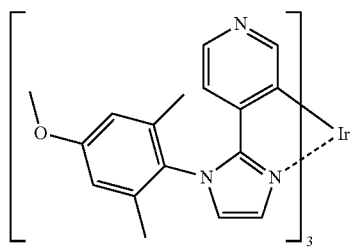
D-75
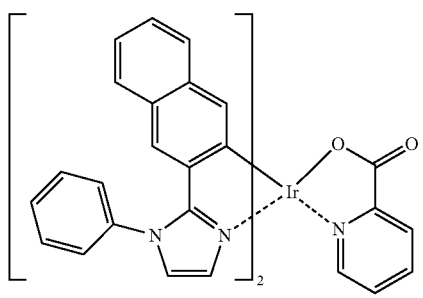
D-76
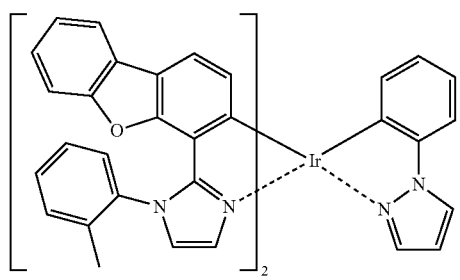
D-77
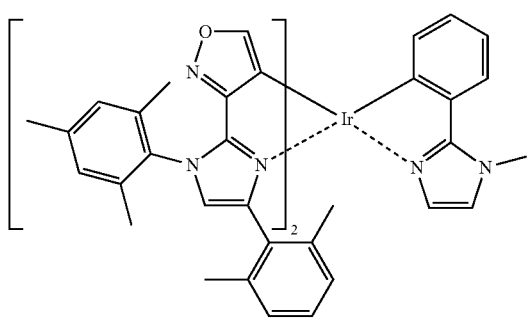
D-78
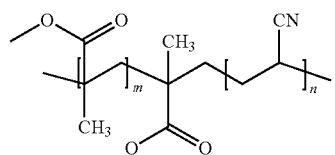
D-79
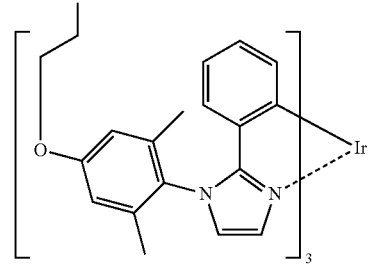

[Chemical Formula 21]

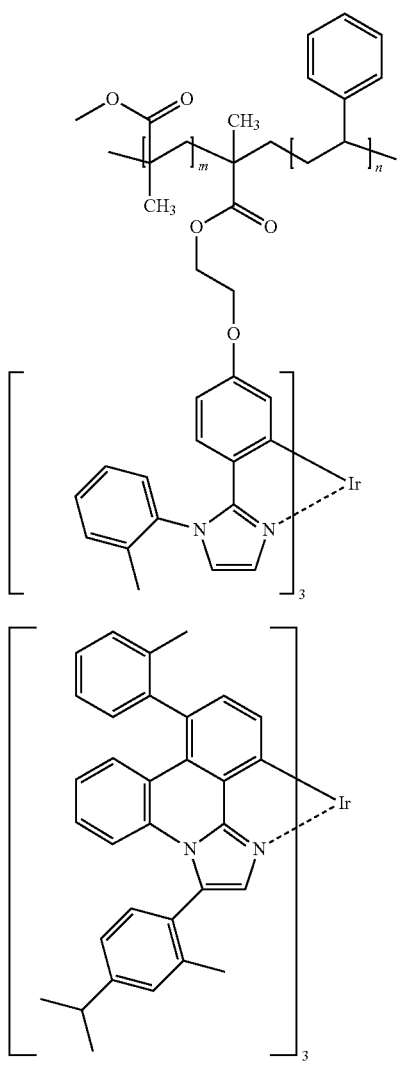

D-80

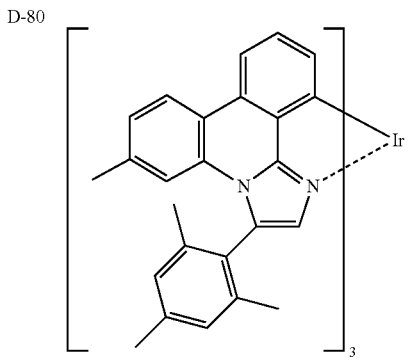

D-81

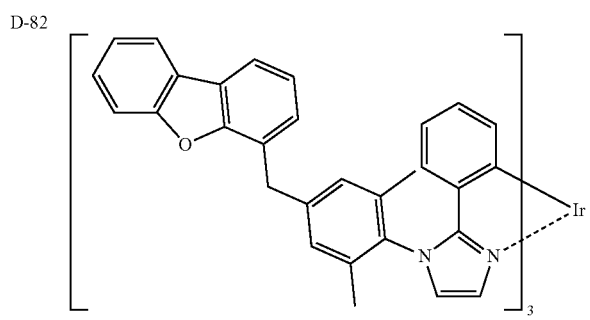

D-82, D-83

[Chemical Formula 22]

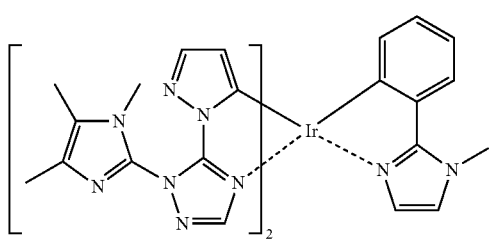

D-84

(3) Phosphorescent Dopant (Also Referred to as Fluorescent Dopant or Fluorescent Material)

Examples of the fluorescent dopant include coumarin dyes, pyran dyes, cyanine dyes, chroconium dyes, squarylium dyes, oxobenzanthracene dyes, fluorescein dyes, rhodamine dyes, pyrylium dyes, perylene dyes, stilbene dyes, polythiophene dyes, and fluorescent rare earth complexes.

<<Injection Layers: Hole Injection Layer and Electron Injection Layer>>

The organic EL device of the present invention may optionally be provided with one or more injection layers. The injection layers are optionally disposed between the electrode that serves as an anode and the luminous layer or the electrode that serves as an anode and the hole transport layer, and between the electrode that serves as a cathode and the luminous layer or the electrode that serves as a cathode and the electron transport layer.

The injection layer is provided in order to reduce the driving voltage and to improve the luminance, and is described in detail in, for example, "Denkyoku zairyo (Electrode material)", Div. 2, Chapter 2 (pp. 123-166) of "Yuki EL soshi to sono kogyoka saizensen (Organic EL device and its frontier of industrialization)" (published by NTS Corporation, Nov. 30, 1998). The injection layers are categorized as a hole injection layer (anode buffer layer) and an electron injection layer (cathode buffer layer).

The hole injection layer (anode buffer layer) is described in detail in, for example, Japanese Laid-Open Patent Application Publication Nos. H09-45479, H09-260062, and H08-288069. Specific examples of the hole injection layer include phthalocyanine buffer layers, such as copper phthalocyanine buffer layers, oxide buffer layers, such as vanadium oxide buffer layers, amorphous carbon buffer layers, and polymer buffer layers composed of an electroconductive polymer, such as polyaniline (emeraldine) and polythiophene. Preferred materials of the hole injection layer are also described in Japanese Publication of International Patent Application No. 2003-519432.

The hole injection layer of the present invention may be composed of a plurality of materials, but is preferably composed of a deposited film of a single organic compound because use of a plurality of materials in combination involves a high risk of a variation in performance due to a variable mixing ratio in the deposited layer, due to variations in concentration of the materials on the surface of a substrate where the layer is deposited, for example.

The hole injection layer may have any thickness, usually within the range of 0.1 to 100 nm, preferably within the range of 1 to 30 nm.

Examples of materials suitable for the electron injection layer disposed between the electron transport layer and the upper or lower electrode that serves as a cathode include alkali metal and alkaline earth metal compounds that have a work function of 3 eV or lower. Specific examples of alkali metal compounds include potassium fluoride, lithium fluoride, sodium fluoride, cesium fluoride, lithium oxide, lithium quinoline complexes, and cesium carbonate, among which preferred are lithium fluoride and cesium fluoride.

The electron injection layer may have any thickness, usually within the range of 0.1 to 10 nm, preferably within the range of 0.1 to 2 nm.

<<Blocking Layers: Hole Blocking Layer and Electron Blocking Layer>>

The organic EL device of the present invention may optionally be provided with one or more blocking layers. The blocking layer is, for example, a hole blocking layer described in detail in Japanese Laid-Open Patent Application Publication Nos. H11-204258 and H11-204359, and "Yuki EL soshi to sono kogyoka saizensen (Organic EL device and its frontier of industrialization)" (published by NTS Corporation, Nov. 30, 1998, page 237).

The hole blocking layer functions as an electron transport layer in a broad sense, and is composed of a hole blocking material which has electron transportability and has a very low hole transportability. The hole blocking layer transports electrons and blocks holes, resulting in an increased probability of recombination between the electrons and the holes. The electron transport layer with the structure described below may also be used as a hole blocking layer.

The hole blocking layer provided for the organic EL device of the present invention is preferably disposed adjacent to the luminous layer.

The electron blocking layer functions as a hole transport layer in a broad sense, and is composed of an electron blocking material which has hole transportability and has a very low electron transportability. The electron blocking layer transports holes and blocks electrons, resulting in an increased probability of recombination between the electrons and the holes. The hole transport layer with the structure described below may also be used as an electron blocking layer.

The hole blocking layer and the electron transport layer preferably have a thickness within the range of 3 to 100 nm, more preferably within the range of 5 to 30 nm.

<<Hole Transport Layer>>

The hole transport layer is composed of a hole transport material that has hole transportability. The hole injection layer and the electron blocking layer are also categorized into the hole transport layer in a broad sense. The hole transport layer may have a monolayer or multilayer structure.

The hole transport materials have hole injecting or transporting ability or electron blocking ability, and may be either organic or inorganic materials. Examples of such materials include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styryl anthracene derivatives, fluorenone derivatives, hydrazone derivatives, stilbene derivatives, silazane derivatives, aniline copolymers, and electroconductive high-molecular weight oligomers, particularly thiophene oligomers.

These materials can be used as hole transport materials, and further examples of preferred materials include porphyrin compounds, aromatic tertiary amine compounds, and styrylamine compounds, among which particularly preferred are aromatic tertiary amine compounds.

Typical examples of the aromatic tertiary amine compounds and the styrylamine compounds include N,N,N',N'-tetraphenyl-4,4'-diaminophenyl, N,N'-diphenyl-N,N'-bis(3-methylphenyl)-(1,1'-biphenyl)-4,4'-diamine (hereinafter referred to as "TPD"), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds having two fused aromatic rings per molecule, described in U.S. Pat. No. 5,061,569, such as 4,4'-bis[N-(1-naphthyl)-N-phenylamino]biphenyl (hereinafter referred to as "NPD"), and compounds described in Japanese Laid-Open Patent Application Publication No. H04-308688, such as 4,4',4"-tris[N-(3-methylphenyl)-N-phenylamino]triphenylamine (hereinafter referred to as "MTDATA") in which three triphenylamine units are bonded into a starburst form.

Polymer materials containing the above compounds introduced into their chains or containing the above compounds as main chains can also be used. Inorganic compounds such as p-type Si and p-type SiC can also be used as a hole injection material or a hole transport material.

The hole transport layer may also be composed of any material having so called p-type conductivity. Such materials are described in Japanese Laid-Open Patent Application Publication Nos. H04-297076, 2000-196140, and 2001-102175, J. Appl. Phys., 95, 5773 (2004), Japanese Laid-Open Patent Application Publication No. H11-251067, J. Huang, et al., "Applied Physics Letters", 80 (2002), p. 139, and Japanese Publication of International Patent Application No. 2003-519432. In the present invention, such materials are preferred, which provide a light-emitting device with higher luminous efficiency.

The hole transport layer may have any thickness, normally within the range of 5 nm to 5 μm, preferably within the range of 5 to 200 nm.

The hole transport layer may have a monolayer structure composed of one or more of the materials mentioned above.

<<Electron Transport Layer>>

The electron transport layer is composed of a material having electron transportability, and may have a monolayer or multilayer structure.

The electron transport material used for the electron transport layer may be selected from any conventionally known compounds that can transport electrons injected from an electrode that serves as a cathode to a luminous layer. Examples of such compounds include derivatives of nitro-substituted fluorene, diphenylquinone, thiopyrandioxide, bipyridyl, fluorenylidenemethane, carbodiimide, anthraquinodimethane, anthrone, and oxadiazole. Further examples of the electron transport material include thiadiazole (i.e., a ring in which an oxygen atom in the oxadiazole ring of the oxadiazole derivatives is replaced with a sulfur atom) derivatives, and quinoxaline derivatives having a quinoxaline ring known as an electron-withdrawing group. Polymer materials containing the above compounds introduced into their chains or containing the above compounds as main chains can also be used.

According to the present invention, if an electron transport layer is disposed adjacent to an intermediate electrode, the electron transport layer is preferably composed of a nitrogen-containing organic compound, more preferably a compound containing a pyridine ring.

Further examples of the electron transport material include metal complexes of 8-quinolinol, such as tris(8-quinolinol)aluminum (Alq), tris(5,7-dichloro-8-quinolinol) aluminum, tris(5,7-dibromo-8-quinolinol)aluminum, tris(2-methyl-8-quinolinol)aluminum, tris(5-methyl-8-quinolinol) aluminum, and bis(8-quinolinol)zinc (Znq), and metal complexes formed by replacing the central metal of the above metal complexes with In, Mg, Cu, Ca, Sn, Ga or Pb. Further preferred examples of the electron transport material include a metal-free or metal-containing phthalocyanine and derivatives thereof having an alkyl or sulfonate substituted end. Distyrylpyrazine derivatives known as a material for a luminous layer may also be used as the electron transport material. Inorganic semiconductors such as n-type Si and n-type SiC may also be used as the electron transport material, as well as inorganic semiconductors such as p-type Si and p-type Sic may be used as a hole transport material or a hole injection material for the hole transport layer or the hole injection layer.

The electron transport layer may be composed of a plurality of materials, and may be doped with an alkali metal, an alkaline earth metal, an alkali metal compound, or an alkaline earth metal compound. However, the electron transport layer of the present invention is preferably composed of a deposited film of a single organic compound because use of a plurality of materials in combination involves a high risk of a variation in performance due to a variable mixing ratio in the deposited layer, due to variations in concentration of the materials on the surface of a substrate where the layer is deposited, for example.

The organic compound contained in the electron transport layer preferably has a glass transition temperature of 110° C. or higher, which allows high stability under high-temperature preservation and process.

The electron transport layer may have any thickness, normally within the range of 5 nm to 5 μm, preferably within the range of 5 to 200 nm.

<<Support Substrate>>

The support substrate (hereinafter, also referred to as substrate, base, or support) of the organic EL device of the present invention may be any type of substrate, for example, glass or plastic substrate, and may be transparent or opaque. If light is extracted from the support substrate, the support substrate is preferably transparent. Examples of the preferred transparent support substrate include glass, quartz, and transparent resin films. Particularly, the support substrate is preferably a resin film which can provide a flexible organic EL device.

Examples of the resin film include polyesters, such as poly(ethylene terephthalate) (PET) and polyethylene naphthalate) (PEN); polyethylene; polypropylene;

cellophane; cellulose esters and derivatives thereof, such as cellulose diacetate, cellulose triacetate (TAC), cellulose acetate butyrate, cellulose acetate propionate (CAP), cellulose acetate phthalate, and cellulose nitrate; poly(vinylidene chloride); poly(vinyl alcohol); poly(ethylene-vinyl alcohol); syndiotactic polystyrene; polycarbonates; norbornene resins; polymethylpentene; polyether ketone; polyimides; polyethersulfones (PESs); polyphenylene sulfide; polysulfones; polyether imides; polyether ketone imides; polyamides; fluororesins; nylons; poly(methyl methacrylate); acrylics or polyarylates; and cycloolefin resins, such as ARTON (product name; manufactured by JSR Corporation) and APEL (product name; manufactured by Mitsui Chemicals, Inc.).

The surface of the resin film may be covered with a coating layer of an inorganic or organic material or a hybrid film of inorganic and organic materials. The resin film is preferably a gas barrier film having water vapor permeability (measured in accordance with JIS K 7129-1992) of 0.01 g/(m$^2$·24 h) or lower, and is preferably a high barrier film having oxygen permeability (measured in accordance with JIS K 7126-1992) of 1×10$^{-3}$ ml/(m$^2$·24 h·atm) or lower and water vapor permeability of 1×10$^{-3}$ g/(m$^2$·24 h) or lower. The resin film more preferably has water vapor permeability of 1×10$^{-5}$ g/(m$^2$·24 h) or lower and oxygen permeability of 1×10$^{-5}$ ml/(m$^2$·24 h·atm) or lower.

The barrier layer may be composed of any material that can block infiltration of substances, such as moisture and oxygen, which causes deterioration of the organic EL device. For example, silicon oxide, silicon dioxide and silicon nitride can be used. In order to solve the brittleness of the film, the film preferably has a laminated structure composed of an inorganic layer and an organic material layer. The inorganic layer and organic material layer may be deposited in any order, but are preferably deposited alternately a plurality of times.

The barrier layer may be formed by any method, for example, vacuum vapor deposition, sputtering, reactive sputtering, molecular beam epitaxy, cluster ion beam deposition, ion plating, plasma polymerization, atmospheric pressure plasma polymerization, plasma chemical vapor deposition (CVD), laser CVD, thermal CVD, and coating. In particular, the gas barrier layer is preferably produced by an atmospheric pressure plasma polymerization process as described in Japanese Laid-Open Patent Application Publication No. 2004-68143.

Examples of an opaque support substrate include metal plates such as aluminum plate and stainless steel plate, films, opaque resin substrates, and ceramic substrates.

<<Sealing>>

Examples of a sealing means applicable to the organic EL device of the present invention include adhesion of a sealing material, electrodes, and a support substrate with an adhesive.

The sealing material may be disposed to cover a display area of the organic EL device. The sealing material may have a concave or flat shape, and transparency and electric insulation are no object.

Specific examples of the sealing material include glass plates, composite materials of a polymer plate and film, and composite materials of a metal plate and film. Specific examples of materials for the glass plate include soda-lime glass, barium-strontium-containing glass, lead glass, aluminosilicate glass, borosilicate glass, barium borosilicate glass, and quartz. Examples of materials for the polymer plate include polycarbonates, acrylics, polyethylene terephthalate), polyether sulfides, and polysulfones. Examples of materials for the metal plate include one or more metals or alloys selected from the group consisting of stainless steel, iron, copper, aluminum, magnesium, nickel, zinc, chromium, titanium, molybdenum, silicone, germanium, and tantalum.

In the present invention, a polymer film and a metal film may be preferably used as a sealing material, because they contribute to production of low-profile organic EL devices. The polymer film preferably has an oxygen permeability of $1\times10^{-3}$ ml/(m$^2$·24 h·atm) or lower and a water vapor permeability of $1\times10^{-3}$ g/(m$^2$·24 h) or lower, more preferably a water vapor permeability of $1\times10^{-5}$ g/(m$^2$·24 h) or lower and an oxygen permeability of $1\times10^{-5}$ ml/(m$^2$·24 h·atm) or lower.

The sealing material may be processed into a concave shape through any process, for example, sandblasting or chemical etching. Specific examples of the adhesive for sealing include light-curable or thermosetting adhesives having reactive vinyl groups, such as acrylic acid oligomers and methacrylic acid oligomers; moisture-curable resins, such as 2-cyanoacrylic acid esters; thermosetting and chemically curable adhesives (two-component adhesives such as epoxy adhesives; hot-melt adhesives, such as polyamide adhesives, polyester adhesives, and polyolefin adhesives; and cation-curable and ultraviolet-curable epoxy resin adhesives.

The adhesive for sealing can preferably cure and adhere at a temperature within the range from room temperature (25° C.) to 80° C. to prevent deterioration of the organic EL device during a thermal treatment. The adhesive may also contain a desiccant dispersed therein. The adhesive may be coated on a target portion with a commercially available dispenser or by a screen printing process.

The gap between the sealing material and the display area of the organic EL device is preferably filled with an inactive gas, such as nitrogen gas and argon gas, or an inactive liquid, such as fluorohydrocarbon and silicon oil, for the purpose of forming a gaseous or a liquid phase. The gap may also be a vacuum or filled with a moisture-absorbing compound.

Examples of the moisture-absorbing compound include metal oxides, such as sodium oxide, potassium oxide, calcium oxide, barium oxide, magnesium oxide, and aluminum oxide; sulfates, such as sodium sulfate, calcium sulfate, magnesium sulfate, and cobalt sulfate; metal halides, such as calcium chloride, magnesium chloride, cesium fluoride, tantalum fluoride, cerium bromide, magnesium bromide, barium iodide, and magnesium iodide; and perchlorates, such as barium perchlorate and magnesium perchlorate. Anhydrous salt are preferably used for sulfates, metal halides, and perchlorates.

<<Protective Film and Protective Plate>>

In order to enhance the mechanical strength of the organic EL device, a protective film or plate may be provided on the outer side of the sealing film. If the sealing is performed by the sealing film described above, the mechanical strength of the organic EL device is not necessarily high, and thus such a protective film or plate is preferably formed. Examples of a material usable for such a protective film or plate include the same glass plates, composite materials of a polymer plate and film, and composite materials of a metal plate and film as those which can be used for the sealing. A polymer film is preferably used, from the perspective of weight saving and thinning of the organic EL device.

<<Anode>>

The anode (selected from the upper and lower electrodes) of the organic EL device of the present invention is preferably composed of an electrode material such as a metal, an alloy, an electrically conductive compound, or a mixture thereof that has a high work function (4 eV or higher). Specific examples of such an electrode material include conductive transparent materials such as metals such as Au, Ag, and Al, CuI, indium-tin oxide (hereinafter, abbreviated as "ITO"), SnO$_2$, and ZnO. Amorphous materials applicable to production of a transparent conductive film, such as IDIXO (In$_2$O$_3$—ZnO), may also be used.

The anode may also be produced by forming the electrode material into a thin film by a method such as vapor deposition or sputtering, and then producing a desired shape of pattern by a method such as a photolithographic process. If high pattern accuracy (approximately 100 µm or higher) is not required, the pattern may be formed via a mask having a desired shape during the time of vapor deposition or sputtering of the electrode material. Alternatively, the film may be formed with a material which can be coated, such as an organic conductive compound, through a wet process, for example, printing or coating.

When luminescence is extracted from the anode, the anode preferably has a transmittance of above 10%. The sheet resistance of the anode is preferably several hundred ohms per sheet or lower.

The thickness of the anode is normally within the range of 5 to 1000 nm, preferably within the range of 5 to 200 nm, although it depends on the electrode material.

<<Cathode>>

The cathode (selected from the upper and lower electrodes) of the organic EL device of the present invention is preferably composed of an electrode material such as a metal, an alloy, an electrically conductive compound, or a mixture thereof. Specific examples of such an electrode material include sodium, sodium-potassium alloys, magnesium, lithium, magnesium/copper mixtures, magnesium/silver mixtures, magnesium/aluminum mixtures, magnesium/indium mixtures, aluminum/aluminum oxide (Al$_2$O$_3$) mixtures, indium, lithium/aluminum mixtures, rare earth metals, silver, and aluminum. From the perspective of electron injection and resistance to oxidation, it is preferable to use a mixture of an electron-injecting metal and a second metal which is a stable metal with a higher work function than the electron-injecting metal, among these materials. Preferred examples of such a mixture include magnesium/silver mixtures, magnesium/aluminum mixtures, magnesium/indium mixtures, aluminum/aluminum oxide (Al$_2$O$_3$) mixtures, lithium/aluminum mixtures, aluminum, and silver.

The cathode can be produced by forming such an electrode material into a thin film using any process, for example, vapor deposition or sputtering.

The sheet resistance of the cathode is preferably several hundred ohms per sheet or lower. The film thickness of the cathode is normally within the range of 5 nm to 5 µm, preferably within the range of 5 to 200 nm.

In order to allow the emitted light to transmit, either the anode or the cathode of the organic EL device is preferably transparent or translucent, which improves the luminance of the emitted light.

After any of the metals exemplified above is deposited into a thin film with a thickness of 1 to 20 nm on a cathode, any of the transparent conductive materials exemplified in the description of the anode is deposited thereon to produce a transparent or translucent cathode. This process can be applied to production of an organic EL device having an anode and a cathode that have transparency.

<<Production of Organic EL Device>>

A method of producing the organic EL device will now be described. The organic EL device has a layer configuration including a lower electrode (anode), a first light-emitting unit, a first intermediate electrode, a second light-emitting unit, a second intermediate electrode, a third light-emitting unit, and an upper electrode (cathode). The first light-emitting unit is composed of a hole injection layer, a hole transport layer, a luminous layer, and an electron transport layer that are deposited in sequence on the anode. The second light-emitting unit is composed of a hole injection layer, a hole transport layer, a luminous layer, a hole blocking layer, and an electron transport layer that are deposited in sequence on the first intermediate electrode. The third light-emitting unit is composed of a hole injection layer, a hole transport layer, a luminous layer, a hole blocking layer, an electron transport layer, and an electron injection layer that are deposited in sequence on the second intermediate electrode.

An intended electrode material, for example, an anode material, is deposited onto an appropriate substrate by any thin-film forming process such as vapor deposition or sputtering into a thickness of 1 µm or less, preferably 10 to 200 nm, to form a lower electrode that functions as an anode.

Subsequently, a hole injection layer, a hole transport layer, a luminous layer, and an electron transport layer that constitute the first light-emitting unit are formed onto the lower electrode.

In deposition of the layers constituting the first light-emitting unit, the individual layers may be deposited by different processes. If a vapor deposition process is employed for film formation, the deposition conditions vary depending on compounds to be used, and are preferably selected appropriately from the following general ranges: a boat heating temperature of 50 to 450° C., a degree of vacuum of $1\times10^{-6}$ to $1\times10^{-2}$ Pa, a deposition rate of 0.01 to 50 nm per second, a substrate temperature of −50 to 300° C., and a layer thickness of 0.1 nm to 5 µm, preferably 5 to 200 nm.

After deposition of these layers, a metal layer composed of a metal with a work function of 3 eV or lower and a metal layer adjacent thereto composed of a metal with a work function of 4 eV or higher are deposited over these layers by a vapor deposition process, such that the total thickness of the two metal layers is 15 nm or less. A first intermediate electrode is formed.

Individual layers constituting the second light-emitting unit are then deposited by the same process as in the film formation in the first light-emitting unit, except that a hole blocking layer is disposed adjacent to the luminous layer. Subsequently, the second intermediate electrode is formed by the same process as in the formation of the first intermediate electrode.

A hole injection layer, a hole transport layer, a luminous layer, a hole blocking layer, and an electron transport layer of the third light-emitting unit are then formed in the same process as in the film formation of the second light-emitting unit, and an electron injection layer is further deposited.

A cathode material is then deposited by a process such as vapor deposition and sputtering, such that the film thickness is 1 µm or less, preferably within the range of 5 to 200 nm, thereby providing an upper electrode that may serves as a cathode. Thus, a desired organic EL device can be produced.

In production of such an organic EL device, all layers from the hole injection layer of the first light-emitting unit to the upper electrode should preferably be formed in a single vacuuming operation, but a partly formed organic EL device may be taken out for a different deposition process. In such a case, the process is performed under dry inactive gas atmosphere, which prevents damage of the organic EL device caused by moisture or oxygen, for example.

Alternatively, the layers of the organic EL device may be deposited in a reverse order. That is, the organic EL device may have a structure composed of a lower electrode (cathode), a first light-emitting unit, a first intermediate electrode, a second light-emitting unit, a second intermediate electrode, a third light-emitting unit, and an upper electrode (anode). In such a case, for example, the first light-emitting unit is composed of an electron injection layer, an electron transport layer, a hole blocking layer, a luminous layer, a hole transport layer, and a hole injection layer, that are deposited in sequence on the lower electrode (cathode). The second light-emitting unit is composed of an electron transport layer, a hole blocking layer, a luminous layer, a hole transport layer, and a hole injection layer that are deposited in sequence on the first intermediate electrode. The third light-emitting unit is composed of an electron transport layer, a luminous layer, a hole transport layer, and a hole injection layer that are deposited in sequence on the second intermediate electrode.

The resulting organic EL device can emit light when a DC voltage of about 2 to 40 V is applied across the anode with positive polarity and the cathode with negative polarity. Alternatively, an AC voltage of any waveform may be applied.

<<Techniques for Enhancing Light Extraction Efficiency>>

In general, in an organic EL device, light emission occurs inside a layer with a refractive index higher than that of the air (that is, a layer with a refractive index within the range of 1.6 to 2.1), and mere 15 to 20% of the light emitted from the luminous layer can be extracted. This is because incident light on an interface (interface between a transparent substrate and the air) at an incident angle θ equal to or greater than a critical angle is totally reflected and cannot be extracted from the device, or because light is totally reflected at the interface between the transparent electrode or the luminous layer and the transparent substrate and is guided to the transparent electrode or the luminous layer to be released to the side of the device.

Examples of the measure for enhancing the light extraction efficiency include: asperities formed on a surface of a transparent substrate to prevent total reflection at the interface between the transparent substrate and the air (see, for example, U.S. Pat. No. 4,774,435); a substrate with light-condensing property to improve the light extraction efficiency (see, for example, Japanese Laid-Open Patent Application Publication No. 563-314795); a reflection surface formed on the side surface of the device (see, for example, Japanese Laid-Open Patent Application Publication No. H01-220394); a smooth antireflective layer formed between a substrate and a luminous material, the antireflective layer having a refractive index between those of the substrate and the luminous material (see, for example, Japanese Laid-Open Patent Application Publication No. S62-172691); a smooth layer disposed between a substrate and a luminous material, the smooth layer having a refractive index lower than that of the substrate (see, for example, Japanese Laid-Open Patent Application Publication No. 2001-202827); and a diffraction grating formed at an interface between any layers selected from a substrate, a transparent electrode layer, and a luminous layer (including the interface between the substrate surface and the exterior) (Japanese Laid-Open Patent Application Publication No. H 11-283751).

In the present invention, these methods can be employed in combination with the organic EL device of the present invention. Preferably a smooth layer having a refractive index lower than that of the substrate should be disposed between a substrate and a luminous material. In alternative preferred embodiment, a diffraction grating is formed at an interface between any layers selected from a substrate, a transparent electrode layer, and a luminous layer (including the interface between the substrate surface and the exterior).

The present invention in combination with such measures provides a device with higher luminance and durability.

If a medium having a low refractive index and having a thickness greater than light wavelength is disposed between a transparent electrode and a transparent substrate, the extraction efficiency of light from the transparent electrode to the exterior increases as the refractive index of the medium decreases.

Examples of the layer with a low refractive index include aerogel, porous silica, magnesium fluoride, and fluoropolymer layers. Since a transparent substrate generally has a refractive index of about 1.5 to 1.7, the layer with a low refractive index preferably has a refractive index of about 1.5 or lower, more preferably 1.35 or lower.

The medium with a low refractive index preferably has a thickness two or more times a light wavelength in the medium by the following reason: If the medium with a low refractive index has a thickness similar to that of the light wavelength, the electromagnetic wave leaking as an evanescent wave penetrates into the substrate, resulting in a reduction in advantage of the layer with a low refractive index.

A diffraction grating disposed at an interface or in any medium where total reflection occurs can effectively enhance the light extraction efficiency. This method utilizes the property of a diffraction grating that can change the direction of light to a specific direction, different from the direction of refracted light, by Bragg diffraction such as primary diffraction or secondary diffraction. In this method, a diffraction grating is disposed at an interface between any layers or in any medium (in a transparent substrate or a transparent electrode) to diffract and extract the light that is emitted from a luminous layer and that cannot be extracted due to total reflection occurring at the interface between the layers.

The diffraction grating to be disposed preferably has a two-dimensional periodic refractive index because light generated in a luminous layer is emitted at random in all directions but a common one-dimensional diffraction grating having a periodic refractive index distribution only in a specific direction can diffract only the light proceeding in a specific direction and thus cannot significantly increase the light extraction efficiency.

A diffraction grating having a two-dimensional refractive index distribution allows diffraction of light propagating in all directions and enhances the light extraction efficiency.

The diffraction grating may be disposed in an interface between any layers or in any medium (in a transparent substrate or a transparent electrode), but is preferably disposed close to a luminous layer generating light. The period of the diffraction grating is preferably about ½ to 3 times the wavelength of light in a medium. The array of the diffraction grating is preferably a two-dimensionally repeated array such as a square lattice, a triangular lattice or a honeycomb lattice.

The organic EL device of the present invention can enhance the luminance in a specific direction, for example, in the front direction with respect to the luminous surface of the device by condensing the light in the specific direction, with a microlens array structure disposed on the light extraction side of the support substrate, or a light-condensing sheet provided to the device.

In an example of a microlens array, quadrangular pyramids having a side of 30 µm and having a vertex angle of 90 degrees are two-dimensionally arranged on the light extraction side of the support substrate. The quadrangular pyramid preferably has a side of 10 to 100 µm. If the length of the side is shorter than this range, the light is colored due to the effect of diffraction, whereas if it is significantly long, the thickness of the array is unfavorably large.

The light-condensing sheets can be practically used in LED backlights of liquid crystal display devices, such as a brightness-enhancing film (BEF) produced by SUMITOMO 3M Inc.

The prism sheet may be a substrate having any shape, for example, triangle-shaped stripes each having a vertex angle of 90 degrees and a pitch of 50 µm, a shape having round apexes, a shape having randomly changed pitches, or other shapes.

Alternatively, the light-condensing sheet may be used in combination with a light diffusion plate or film in order to control the emission angle of light from the organic EL device. For example, a diffusion film (Light-Up) manufactured by KIMOTO Co., Ltd., can be used.

<<Display Device>>

A display device provided with the organic EL device of the present invention will be now described.

The organic EL device of the present invention is preferably applied to a display device. If the organic EL device is applied to a display device, a shadow mask is provided only during formation of the luminous layer, and the film can be deposited on a single side by a process such as vapor deposition, casting, spin coating, ink jetting, printing, or slot type coating. Only the luminous layer can be patterned by any process, preferably by vapor deposition, ink jetting, or printing. If vapor deposition is employed, patterning is preferably performed through a shadow mask.

The resulting display device can emit light when a DC voltage of about 2 to 40 V is applied across the anode with positive polarity and the cathode with negative polarity.

<<Lighting Device>>

A lighting device provided with the organic EL device of the present invention will be now described.

The organic EL device of the present invention can be applied to lamps such as a lighting source and an exposure light source, or can be applied to projectors for projecting images or display devices (displays) for directly viewing still or moving images. If the organic EL device of the present invention is applied to a display device for playing moving images, the driving mode may be either a simple matrix (passive matrix) mode or active matrix mode.

The organic EL device applied to a lighting device may be subjected to patterning during the deposition process through a metal mask or by ink jet printing, if necessary. The patterning is targeted to only the electrode(s), both the electrode(s) and the luminous layer, or all the layers of the device.

The present invention will now be described in more detail by way of Examples. The present invention however should not be limited to these Examples. Throughout the Examples, the symbol "%" indicates "mass %" unless otherwise stated.

The compounds used in the individual Examples have a structure represented by the following Formulae:

[Chemical Formula 23]

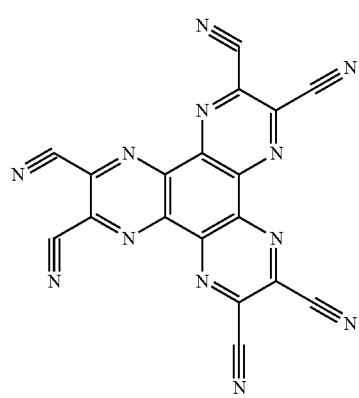
M-1

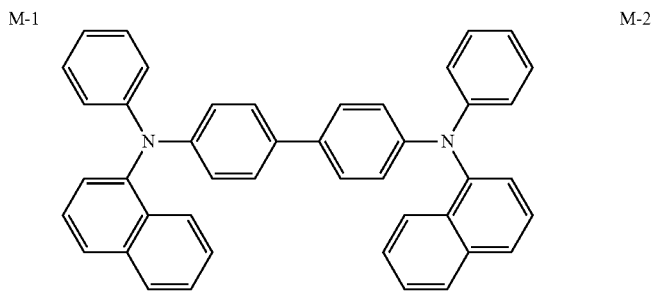
M-2

[Chemical Formula 24]

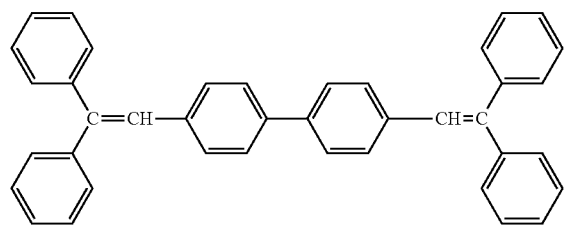
BD-1

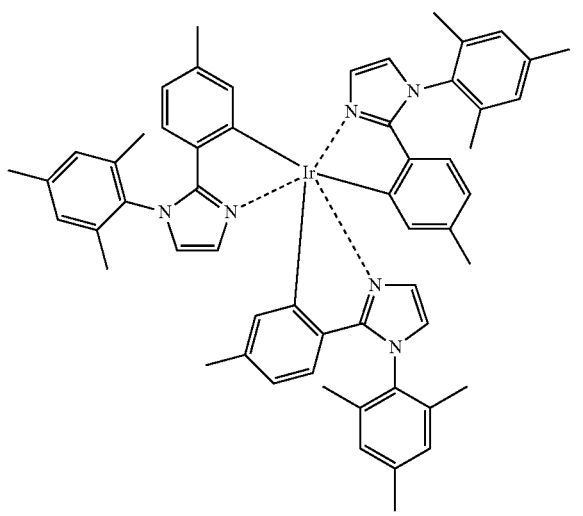
BD-2

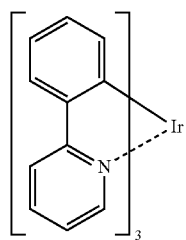
GD-1

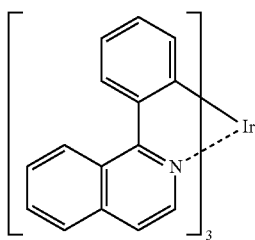
RD-1

[Chemical Formula 25]

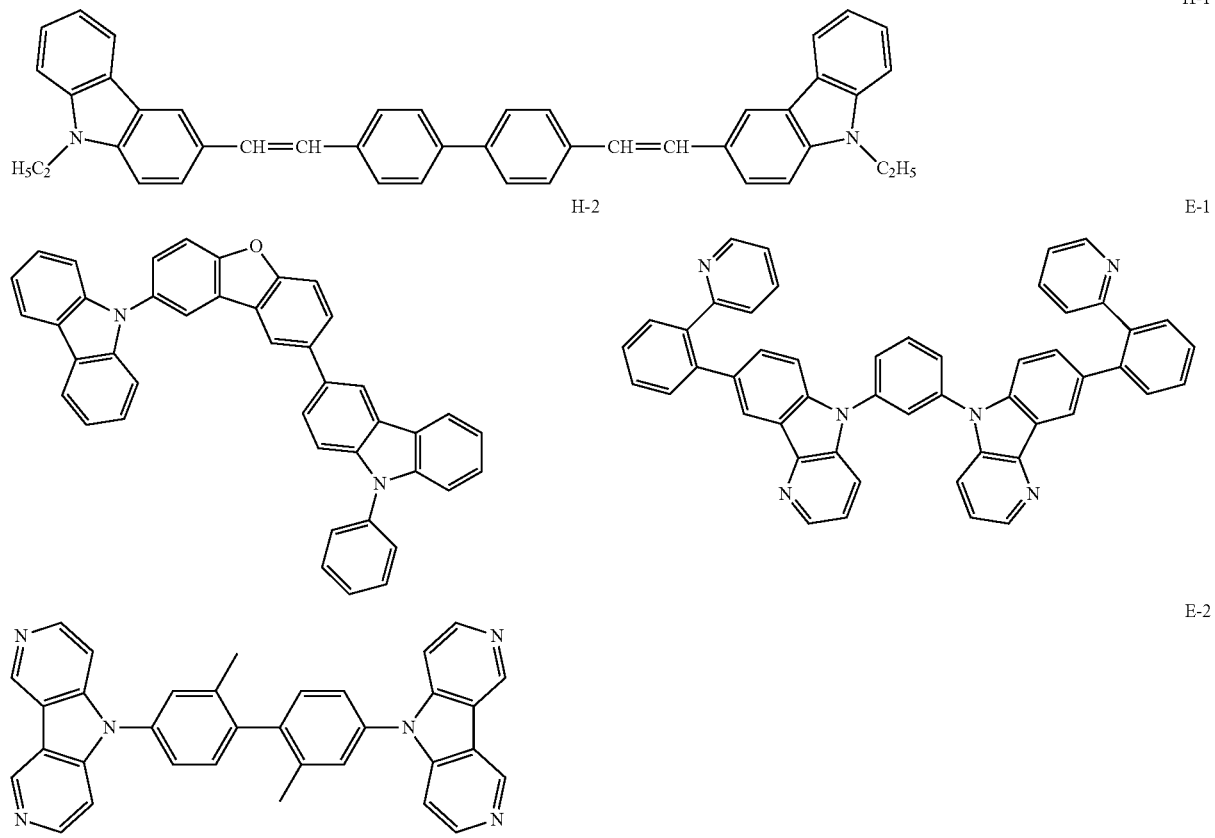

Example 1

Preparation of Organic EL Devices (1) Preparation of Organic EL Device 101

A lower electrode of indium tin oxide (ITO) with a thickness of 150 nm was formed on a glass substrate having a size of 30 mm by 30 mm and a thickness of 0.7 mm, and was etched to form a pattern. After the patterning, the transparent support substrate provided with the ITO transparent electrode was cleaned with isopropyl alcohol by ultrasonic agitation, was dried in a dry nitrogen gas atmosphere, and was cleaned in a UV ozone environment for 5 minutes. The transparent support substrate was fixed to a substrate holder in a commercially available vacuum evaporation system.

Materials for individual layers were placed into individual vapor deposition crucibles in the vacuum evaporation system. The individual materials were used in optimum amounts for producing a device. The vapor deposition crucibles used were composed of a material for resistance heating, such as molybdenum or tungsten.

After the apparatus was evacuated to a degree of vacuum of $1 \times 10^{-4}$ Pa, the vapor deposition crucible containing Compound M-1 was electrically heated to deposit Compound M-1 onto the transparent support substrate at a deposition rate of 0.1 nm/sec, thereby forming a layer with a thickness of 15 nm.

Compound M-2 was then deposited in the same way into a layer with a thickness of 70 nm.

Compounds GD-1 and H-2 were then codeposited at a deposition rate of 0.1 nm/sec such that the deposited layer contained 8% Compound GD-1, thereby forming a green phosphorescent layer with a thickness of 35 nm.

Compound H-2 was then deposited at a deposition rate of 0.1 nm/sec into a layer with a thickness of 5 nm, and Compound E-1 was deposited thereon at a deposition rate of 0.1 nm/sec into a layer with a thickness of 25 nm, thereby forming a green phosphorescent light-emitting unit.

Subsequently, lithium was deposited into a thickness of 1 nm, and then silver was deposited thereon into a thickness of 8 nm, thereby forming a first intermediate electrode.

Subsequently, Compounds M-1 and M-2 were deposited at a deposition rate of 0.1 nm/sec into layers with a thickness of 15 nm and 40 nm, respectively.

Subsequently, Compounds GD-1, RD-1 and H-2 were codeposited at a deposition rate of 0.1 nm/sec such that the resulting layer contained 15% Compound GD-1 and 4% Compound RD-1, thereby forming a red phosphorescent layer with a thickness of 30 nm.

Compound H-2 was then deposited at a deposition rate of 0.1 nm/sec into a layer with a thickness of 5 nm, and Compound E-1 was deposited thereon at a deposition rate of 0.1 nm/sec into a layer with a thickness of 25 nm, thereby forming a red phosphorescent light-emitting unit.

Subsequently, the second intermediate electrode was formed as in the first intermediate electrode.

Subsequently, Compounds M-1 and M-2 were deposited at a deposition rate of 0.1 nm/sec into layers with a thickness of 15 nm and 50 nm, respectively.

Subsequently, Compounds BD-1 and H-1 were codeposited at a deposition rate of 0.1 nm/sec such that the resulting layer contained 5% Compound BD-1, thereby forming a blue phosphorescent layer with a thickness of 35 nm.

Subsequently, Compound E-1 was deposited at a deposition rate of 0.1 nm/sec into a layer with a thickness of 35 nm, thereby forming a blue phosphorescent light-emitting unit.

Subsequently, lithium and aluminum were deposited into a thickness of 1 nm and 120 nm, respectively, thereby forming an upper electrode.

Figure 2:
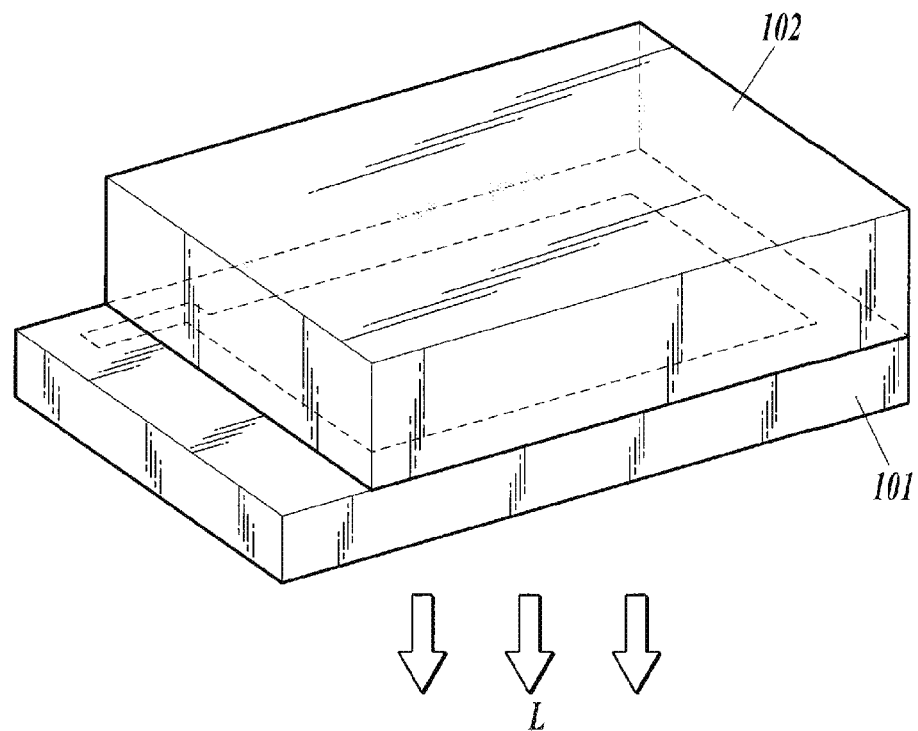
FIG. 2 is a schematic view illustrating an example of a lighting device provided with the organic EL device of the present invention.
Figure 3:
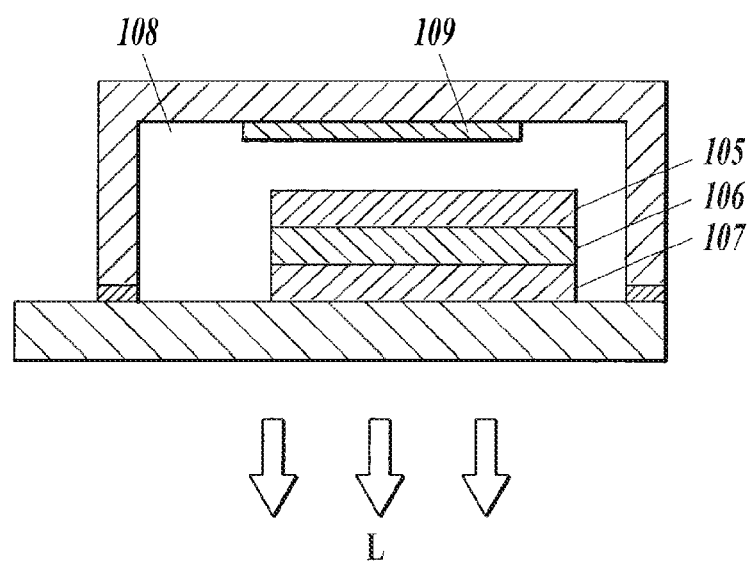
FIG. 3 is a cross-sectional view illustrating an example of a lighting device provided with the organic EL device of the present invention.

The non-luminous surface of the device was then covered with a glass case, thereby preparing the "organic EL device 101" having a structure shown in FIG. 2 and FIG. 3.

FIG. 2 shows a schematic view of the organic EL device. As shown in FIG. 2, the organic EL device 101 is covered with a glass cover 102. Sealing with the glass cover 102 was performed under a high-purity (99.999% or higher) nitrogen gas atmosphere in a glovebox to avoid exposure of the organic EL device 101 to the air.

FIG. 3 shows a cross-sectional view of the organic EL device. As shown in FIG. 3, a plurality of light-emitting units and intermediate electrodes 106, and an upper electrode 105 are laminated on a glass substrate 107 provided with a transparent lower electrode. The glass cover 102 is filled with nitrogen gas 108 and is provided with a water-trapping agent 109.

(2) Preparation of Organic EL Device 102

The "organic EL device 102" was prepared as in the organic EL device 101, except that the silver layer in the first and second intermediate electrodes had a thickness of 13 nm.

(3) Preparation of Organic EL Device 103

The "organic EL device 103" was prepared as in the organic EL device 101, except that the silver layer in the first and second intermediate electrodes had a thickness of 3 nm.

(4) Preparation of Organic EL Device 104

The "organic EL device 104" was prepared as in the organic EL device 101, except that the silver layer in the first and second intermediate electrodes had a thickness of 17 nm.

(5) Preparation of Organic EL Device 105

The "organic EL device 105" was prepared as in the organic EL device 101, except that the lithium layer in the first and second intermediate electrodes had a thickness of 2.5 nm.

(6) Preparation of Organic EL Device 106

The "organic EL device 106" was prepared as in the organic EL device 101, except that the lithium layer in the first and second intermediate electrodes had a thickness of 3.5 nm.

(7) Preparation of Organic EL Device 107

The "organic EL device 107" was prepared as in the organic EL device 101, except that the silver layer in the first and second intermediate electrodes was replaced with an aluminum layer with a thickness of 8 nm.

(8) Preparation of Organic EL Device 108

The "organic EL device 108" was prepared as in the organic EL device 101, except that the lithium layer in the first and second intermediate electrodes was replaced with a calcium layer with a thickness of 1 nm.

(9) Preparation of Organic EL Device 109

The "organic EL device 109" was prepared as in the organic EL device 101, except that no lithium layer was provided in the first and second intermediate electrodes.

(10) Preparation of Organic EL Device 110

The "organic EL device 110" was prepared as in the organic EL device 109, except that the silver layer in the first and second intermediate electrodes had a thickness of 17 nm.

(11) Preparation of Organic EL Device 111

The "organic EL device 111" was prepared as in the organic EL device 101, except that the first and second intermediate electrodes were each composed of a single aluminum layer with a thickness of 8 nm.

(12) Preparation of Organic EL Device 112

The "organic EL device 112" was prepared as in the organic EL device 101, except that the first and second intermediate electrodes were each composed of a single lithium layer with a thickness of 8 nm.

(13) Preparation of Organic EL Device 113

The "organic EL device 113" was prepared as in the organic EL device 101, except that the first and second intermediate electrodes were each composed of a single calcium layer with a thickness of 8 nm.

(14) Preparation of Organic EL Device 114

The "organic EL device 114" was prepared as in the organic EL device 101, except that the first and second intermediate electrodes each composed of a silver layer with a thickness of 8 nm and a lithium layer with a thickness of 1 nm, in sequence from the lower electrode.

(15) Preparation of Organic EL Device 115

The "organic EL device 115" was prepared as in the organic EL device 101, except that the first and second intermediate electrodes each composed of a silver layer with a thickness of 4 nm and an aluminum layer with a thickness of 4 nm, in sequence from the lower electrode.

In each of the organic EL devices, the blue light-emitting unit emits light when a voltage is applied across the upper electrode that serves as a cathode and the second intermediate electrode that serves as an anode, the red light-emitting unit emits light when a voltage is applied across the second intermediate electrode that serves as a cathode and the first intermediate electrode that serves as an anode, and the green light-emitting unit emits light when a voltage is applied across the first intermediate electrode that serves as a cathode and the lower electrode that serves as an anode. In other words, voltages to be applied to the blue, green, and red light-emitting units can be independently and adequately controlled. Thus, the organic EL devices achieve light emission of any color, including white, within a region defined by chromaticity coordinates of the light individually emitted by the blue, green, and red light-emitting units in accordance with the CIE 1931 chromaticity coordinate system, for example.

<<Evaluation of the Organic EL Devices>>

(1) Measurement of the Luminous Efficiency and the Driving Voltage

The individual organic EL devices were measured for a front luminance and angular dependence of luminance with a spectroradiometer CS-2000 (KONICA MINOLTA, INC.) under a current density of 5 mA/cm$^2$ at room temperature (25° C.) to measure the intensity of light emitted from the front surface of the substrate of the individual organic EL devices, thereby determining the individual light efficiencies of the blue, red, and green light-emitting units and the average luminous efficiency of the overall device.

The driving voltages of the individual organic EL units were also determined under a current density of 5 mA/cm$^2$, and the average of these driving voltages was defined as an average driving voltage of the overall light-emitting device.

In the measurement of the luminous efficiency and the driving voltage of the blue light-emitting unit, the intermediate electrodes were connected to an external power source and a voltage was applied across the upper electrode that serves as a cathode and the second intermediate electrode that serves as an anode, while no voltage was applied across the lower electrode and the first intermediate electrode. In the measurement of the red light-emitting unit, a voltage was applied across the second intermediate electrode that serves as a cathode and the first intermediate electrode that serves as an anode, while no voltage was applied to the lower electrode and the upper electrode. In the measurement of the green light-emitting unit, a voltage was applied across the first intermediate electrode that serves as a cathode and the lower electrode that serves as an anode, while no voltage was applied across the second intermediate electrode and the upper electrode.

The results of evaluation are shown in Table 1.

The average luminous efficiency and the average driving voltage of the individual organic EL devices are relative values to the average luminous efficiency and the average driving voltage (set as 100) of the organic EL device 109.

(2) Preservation Stability

The organic EL devices 101 to 103, 105 to 108, 112, and 113 were preserved (left to stand) for 300 hours under an environment at a temperature of 75° C., and the luminous efficiency and the driving voltage of the individual light-emitting units under a current density of 5 mA/cm$^2$ were measured as described above, thereby determining the average luminous efficiency and the average driving voltage of the individual light-emitting units after the preservation. Based on the average luminous efficiency and the average driving voltage before and after the preservation, variation width (%) of the luminous efficiency and variation width (%) of the driving voltage defined by the expression below were calculated as an index of the preservation stability.

The results of the evaluation are shown in Table 1.

Variation in luminous efficiency (%)=Abs[{(average luminous efficiency after the preservation)/(average luminous efficiency before the preservation)}−1]×100

Variation in driving voltage (%)=Abs[{(average driving voltage after the preservation)/(average driving voltage before the preservation)}−1]×100

In the column of materials for intermediate electrodes in Table 1, materials described on the left of the symbol "/" are materials deposited adjacent to the lower electrode.

TABLE 1

| ORGANIC EL DEVICE No. | MATERIALS FOR INTERMEDIATE ELECTRODES (NUMBERS IN PARENTHESES MEAN A LAYER THICKNESS (nm)) | AVERAGE LUMINOUS EFFICIENCY | AVERAGE DRIVING VOLTAGE | PRESERVATION STABILITY VARIATION IN LUMINOUS EFFICIENCY (%) | VARIATION IN DRIVING VOLTAGE (%) | REMARKS |
|---|---|---|---|---|---|---|
| 101 | lithium(1)/silver(8) | 143 | 43 | 0 | 0 | INVENTIVE DEVICE |
| 102 | lithium(1)/silver(13) | 104 | 39 | 3 | 6 | INVENTIVE DEVICE |
| 103 | lithium(1)/silver(3) | 153 | 59 | 40 | 73 | COMPARATIVE DEVICE |
| 104 | lithium(1)/silver(17) | 20 | 33 | — | — | COMPARATIVE DEVICE |
| 105 | lithium(2.5)/silver(8 | 139 | 42 | 2 | 8 | INVENTIVE DEVICE |
| 106 | lithium(3.5)/silver(8) | 134 | 39 | 10 | 33 | INVENTIVE DEVICE |
| 107 | lithium(1)/aluminum(8) | 100 | 46 | 7 | 5 | INVENTIVE DEVICE |
| 108 | silver(8) | 133 | 50 | 12 | 20 | INVENTIVE DEVICE |
| 109 | silver(8) | 100 | 100 | — | — | COMPARATIVE DEVICE |
| 110 | silver(17) | 17 | 93 | — | — | COMPARATIVE DEVICE |
| 111 | aluminum(8) | 34 | 107 | — | — | COMPARATIVE DEVICE |
| 112 | lithium(8) | 139 | 37 | 35 | 77 | COMPARATIVE DEVICE |
| 113 | calcium(8) | 134 | 39 | 29 | 57 | COMPARATIVE DEVICE |
| 114 | silver(8)/lithium(1) | 97 | 111 | — | — | COMPARATIVE DEVICE |
| 115 | silver(4)/aluminum(4) | 76 | 102 | — | — | COMPARATIVE DEVICE |

(3) Summary of the Results

Table 1 demonstrates that the inventive organic EL devices 101, 102, and 105 to 108 have a higher luminous efficiency and a lower driving voltage in comparison with the comparative organic EL devices 104, 109 to 111, 114, and 115. Table 1 also demonstrates that the comparative organic EL devices 103, 112, and 113 have a luminous efficiency and a driving voltage similar to those of the organic EL devices of the present invention, but exhibit significant variations in the luminous efficiency and the driving voltage after preservation under a high-temperature environment, indicating lower preservation stability, in comparison with the organic EL devices of the present invention.

Comparison of the organic EL devices 101 and 102 shows that the metal layer composed of a metal with a work function of 4 eV or higher more preferably has a thickness of 10 nm or less from the perspective of high luminous efficiency. Comparison of the organic EL devices 101, 105, and 106 shows that the metal layer composed of a metal with a work function of 3 eV or lower more preferably has a thickness of 3 nm or less from the viewpoint of high preservation stability.

Comparison of the organic EL devices 101 and 107 demonstrates that silver is a preferred metal with a work function of 4 eV or higher from the viewpoint of high luminous efficiency.

Example 2

Preparation of Organic EL Devices (1) Preparation of Organic EL Device 201

A lower electrode of indium tin oxide (ITO) with a thickness of 150 nm was formed on a glass substrate having a size of 30 mm by 30 mm and a thickness of 0.7 mm, and was etched to form a pattern. After the patterning, the transparent support substrate provided with the ITO transparent electrode was cleaned with isopropyl alcohol by ultrasonic agitation, was dried in a dry nitrogen gas atmosphere, and was cleaned in a UV ozone environment for 5 minutes. The transparent support substrate was fixed to a substrate holder in a commercially available vacuum evaporation system.

Materials for individual layers were placed into individual vapor deposition crucibles in the vacuum evaporation system. The individual materials were used in optimum amounts for producing a device. The vapor deposition crucibles used were composed of a material for resistance heating, such as molybdenum or tungsten.

After the apparatus was evacuated to a degree of vacuum of $1 \times 10^{-4}$ Pa, the vapor deposition crucible containing Compound M-1 was electrically heated to deposit Compound M-1 onto the transparent support substrate at a deposition rate of 0.1 nm/sec, thereby forming a layer with a thickness of 15 nm.

Compound M-2 was then deposited in the same way into a layer with a thickness of 50 nm.

Compounds GD-1, RD-1, and H-2 were then codeposited at a deposition rate of 0.1 nm/sec such that the deposited layer contained 14% Compound GD-1 and 0.02% Compound RD-1, thereby forming a yellow phosphorescent layer with a thickness of 35 nm.

Compound H-2 was then deposited at a deposition rate of 0.1 nm/sec into a layer with a thickness of 5 nm, and Compound E-1 was deposited thereon at a deposition rate of 0.1 nm/sec into a layer with a thickness of 25 nm, thereby forming a yellow phosphorescent light-emitting unit.

Subsequently, lithium was deposited into a thickness of 1 nm, and then silver was deposited thereon into a thickness of 8 nm, thereby forming an intermediate electrode.

Subsequently, Compounds M-1 and M-2 were deposited at a deposition rate of 0.1 nm/sec into layers with a thickness of 15 nm and 70 nm, respectively.

Subsequently, Compounds BD-2 and H-2 were codeposited at a deposition rate of 0.1 nm/sec such that the resulting layer contained 11% Compound BD-2, thereby forming a blue phosphorescent layer with a thickness of 30 nm.

Compound E-1 was then deposited at a deposition rate of 0.1 nm/sec into a layer with a thickness of 30 nm, thereby forming a blue phosphorescent light-emitting unit.

Subsequently, lithium and aluminum were deposited into a thickness of 1 nm and 120 nm, respectively, thereby forming an upper electrode.

The non-luminous surface of the device was then covered with a glass case as in Example 1, thereby preparing the "organic EL device 201" having a structure shown in FIG. 2 and FIG. 3.

(2) Preparation of Organic EL Device 202

The "organic EL device 202" was prepared as in the organic EL device 201, except that Compound E-1 used in preparation of the individual light-emitting units was replaced with Compound E-2.

(3) Preparation of Organic EL Device 203

The "organic EL device 203" was prepared as in the organic EL device 201, except that no lithium layer was provided in the intermediate electrode.

In each of the organic EL devices, the blue light-emitting unit emits light when a voltage is applied across the upper electrode that serves as a cathode and the intermediate electrode that serves as an anode, and the yellow light-emitting unit emits light when a voltage is applied across the intermediate electrode that serves as a cathode and the lower electrode that serves as an anode. In other words, voltages to be applied to the blue and yellow light-emitting units can be independently and adequately controlled. Thus, the organic EL devices achieve light emission of any color on a line defined by chromaticity coordinates of the light individually emitted by the blue and yellow light-emitting units in accordance with the CIE 1931 chromaticity coordinate system, for example.

<<Evaluation of the Organic EL Devices>>

(1) Measurement of the Luminous Efficiency and the Driving Voltage

The individual organic EL devices were evaluated for the average luminous efficiency and the average driving voltage as in Example 1.

The results of evaluation are shown in Table 2.

The average luminous efficiency and the average driving voltage of the individual organic EL devices are relative values to the average luminous efficiency and the average driving voltage (set as 100) of the organic EL device 203.

(2) Evaluation of Preservation Stability

The inventive organic EL devices 201 and 202 were evaluated for preservation stability as in Example 1.

The results of evaluation are shown in Table 2.

In the column of materials for an intermediate electrode in Table 2, materials described on the left of the symbol "/" are materials deposited adjacent to the lower electrode.

TABLE 2

| ORGANIC EL DEVICE No. | MATERIALS FOR A LAYER INCLUDED IN AN INTERMEDIATE ELECTRODE AND POSITIONED ADJACENT TO A LOWER ELECTRODE | MATERIALS FOR AN INTERMEDIATE ELECTRODE (NUMBERS IN PARENTHESES MEAN A LEYER THICKNESS (nm)) | AVERAGE LUMINOUS EFFICIENCY | AVERAGE DRIVING VOLTAGE | PRESERVATION STABILITY | | REMARKS |
|---|---|---|---|---|---|---|---|
| | | | | | VARIATION IN LUMINOUS EFFICIENCY (%) | VARIATION IN DRIVING VOLTAGE (%) | |
| 201 | E-1 | lithium(1)/silver(8) | 217 | 33 | 0 | 0 | INVENTIVE DEVICE |
| 202 | E-2 | lithium(1)/silver(8) | 211 | 34 | 15 | 21 | INVENTIVE DEVICE |
| 203 | E-1 | silver(8) | 100 | 100 | — | — | COMPARATIVE DEVICE |

(3) Summary of the Results

As shown in Table 2, high luminous efficiency and low driving voltage were also observed in the organic EL devices with a single intermediate electrode.

Table 2 also demonstrates that the organic EL device 201 containing Compound E-1 with a pyridine ring as a material for the layer disposed in the intermediate electrode to be adjacent to the lower electrode has a luminous efficiency and a driving voltage similar to those of the organic EL device 202 containing Compound E-2 with no pyridine ring instead of Compound E-1, and exhibits excellent preservation stability.

INDUSTRIAL APPLICABILITY

The present invention provides a color-adjustable organic EL device that includes an intermediate electrode with high light transmittance and conductivity, and thus has high luminous efficiency, low driving voltage and excellent preservation stability.

REFERENCE NUMERAL LIST

1 organic EL device
2 support substrate
4 lower electrode
6, 10 light-emitting units
8 intermediate electrode
8a, 8b metal layers
12 upper electrode
101 organic EL device
102 glass cover
105 upper electrode
106 light-emitting unit and intermediate electrode
107 glass substrate with a transparent lower electrode
108 nitrogen gas
109 water-trapping agent
L light

The invention claimed is:

1. An organic electroluminescent device comprising at least two light-emitting units and at least one intermediate electrode that are disposed between a lower electrode and an upper electrode, the at least one intermediate electrode being electrically connected to an external power source and disposed between the at least two light-emitting units, wherein:

at least one of the at least one intermediate electrode consists of a first metal layer comprising a metal with a work function of 3 eV or lower and a second metal layer adjoining the first metal layer, the second metal layer comprising another metal with a work function of 4 eV or higher, the first and second metal layers having a total thickness within the range of 5 nm to 15 nm;

the second metal layer is planarly continuous; and the first metal layer is adjacent to an anode side of the second metal layer, when a voltage is applied across the intermediate electrode and the electrode opposing the intermediate electrode.

2. The organic electroluminescent device according to claim 1, wherein the first metal layer has a thickness of 3 nm or less.

3. The organic electroluminescent device according to claim 1, wherein the second metal layer has a thickness of 10 nm or less.

4. The organic electroluminescent device according to claim 1, wherein the second metal layer comprises silver.

5. The organic electroluminescent device according to claim 1, wherein the first metal layer comprises lithium or calcium.

6. The organic electroluminescent device according to claim 1, wherein the light-emitting units separated by the intermediate electrode emit light of different colors.

7. The organic electroluminescent device according to claim 1, wherein the at least two light-emitting units comprises at least three light-emitting units and the at least one intermediate electrode comprises at least two intermediate electrodes that are disposed between the lower electrode and the upper electrode, each intermediate electrode being electrically connected to an external power source and disposed between two of the at least three light-emitting units.

8. The organic electroluminescent device according to claim 1, emitting white light through mixing of color light components emerging from the light-emitting units.

9. The organic electroluminescent device according to claim 1, wherein the first metal layer consists of one metal with a work function of 3 eV or lower and the second metal layer consists of one metal with a work function of 4 eV or higher.

10. The organic electroluminescent device according to claim 1, wherein the thickness of the first metal layer is less than the thickness of the second metal layer.

11. The organic electroluminescent device according to claim 6, wherein each of the light-emitting units can driven independently and wherein the device is color-adjustable.

12. The organic electro luminescent device according to claim wherein the at least intermediate electrode has conductivity in a planar direction.

* * * * *